(12) United States Patent
Takahashi

(10) Patent No.: US 7,630,057 B2
(45) Date of Patent: Dec. 8, 2009

(54) PROJECTION OPTICAL SYSTEM, EXPOSURE APPARATUS, AND DEVICE MANUFACTURING METHOD

(75) Inventor: Tomowaki Takahashi, Tokyo (JP)

(73) Assignee: Nikon Corporation, Tokyo (JP)

( * ) Notice: Subject to any disclaimer, the term of this patent is extended or adjusted under 35 U.S.C. 154(b) by 526 days.

(21) Appl. No.: 11/508,290

(22) Filed: Aug. 23, 2006

(65) Prior Publication Data

US 2007/0046918 A1    Mar. 1, 2007

(30) Foreign Application Priority Data

Aug. 24, 2005 (JP) .............................. 2005-242445
Aug. 7, 2006 (WO) ................ PCT/JP2006/315577

(51) Int. Cl.
*G03B 27/54* (2006.01)
*G03B 27/42* (2006.01)
*G02B 5/10* (2006.01)

(52) U.S. Cl. ............................. 355/67; 355/53; 359/859
(58) Field of Classification Search .................... 355/52, 355/53, 55, 67–71; 359/365, 857–859, 725, 359/731
See application file for complete search history.

(56) References Cited

U.S. PATENT DOCUMENTS

| | | | |
|---|---|---|---|
| 5,686,728 A | 11/1997 | Shafer | |
| 6,109,756 A | 8/2000 | Takahashi | |
| 6,172,825 B1 | 1/2001 | Takahashi | |
| 6,213,610 B1 | 4/2001 | Takahashi et al. | |
| 6,302,548 B2 | 10/2001 | Takahashi et al. | |
| 6,556,648 B1 | 4/2003 | Bal et al. | |
| 6,710,917 B2 | 3/2004 | Mann et al. | |
| 6,781,671 B2 * | 8/2004 | Komatsuda | 355/67 |
| 7,436,589 B2 * | 10/2008 | Takahashi | 359/365 |
| 2002/0129328 A1 | 9/2002 | Komatsuda | |
| 2004/0125353 A1 | 7/2004 | Takahashi | |
| 2004/0189965 A1 | 9/2004 | Takahashi | |
| 2004/0189968 A1 | 9/2004 | Terasawa | |
| 2006/0098273 A1 | 5/2006 | Takahashi | |

FOREIGN PATENT DOCUMENTS

| | | |
|---|---|---|
| JP | 2002-116382 | 4/2002 |
| JP | 2005-189248 | 7/2005 |
| WO | WO 2005/062101 | 7/2005 |

* cited by examiner

*Primary Examiner*—Hung Henry Nguyen
(74) *Attorney, Agent, or Firm*—Finnegan, Henderson, Farabow, Garrett & Dunner, L.L.P.

(57) ABSTRACT

An 8-mirror reflecting type projection optical system. A first reflecting image forming optical system forms an intermediate image of a first surface and a second reflecting image forming optical system forms an image of that intermediate image on a second surface. The first reflecting image forming optical system has a first reflecting mirror M1, a second reflecting mirror M2, a third reflecting mirror M3, and a fourth reflecting mirror M4. The second reflecting image forming optical system has a fifth reflecting mirror M5, a sixth reflecting mirror M6, a seventh reflecting mirror M7, and an eighth reflecting mirror M8. The first reflecting mirror M1, the fourth reflecting mirror M4, the fifth reflecting mirror M5, and the eighth reflecting mirror M8 have concave reflecting surfaces, and the seventh reflecting mirror M7 has a convex reflecting surface. One of the second reflecting mirror M2 and the third reflecting mirror M3 has a concave reflecting surface, and the other has a convex reflecting surface. The width dimension of an arcuate effective image forming region is relatively large.

25 Claims, 11 Drawing Sheets

PROJECTION OPTICAL SYSTEM, EXPOSURE APPARATUS, AND DEVICE MANUFACTURING METHOD

CROSS REFERENCE TO RELATED APPLICATIONS

This U.S. patent application claims priority to Japanese Patent Application No. JP 2005-242445, filed on Aug. 24, 2005, and International (WO) Patent Application No. JP2006315577 filed on Aug. 7, 2006, the contents of which are incorporated herein by reference.

BACKGROUND OF THE INVENTION

1. Technical Field

The present invention relates to a projection optical system, an exposure apparatus, and a device manufacturing method, and relates, for example, to a reflecting type projection optical system for x-ray projection exposure apparatuses that use x-rays to transfer a circuit pattern on a mask onto a photosensitive substrate by means of a mirror projection system.

2. Background Art

Conventionally, an exposure apparatus that uses x-rays has gained attention as an exposure apparatus used in the manufacture of semiconductor devices, etc. If x-rays are used as the exposure light, there are only limited choices of transmitting optical materials and refracting optical materials, so in addition to using a reflecting type mask, a reflecting type projection optical system is used. Conventionally, a 4-mirror reflecting type optical system or a 6-mirror reflecting type optical system comprising four or six reflecting mirrors and having an image side numerical aperture of approximately 0.1 to 0.2 have been proposed as a projection optical system that can be adapted to exposure apparatus that uses x-rays as the exposure light.

In addition, recently, an 8-mirror reflecting type optical system that comprises eight reflecting mirrors and has an image side numerical aperture of 0.3 or more has been proposed as a projection optical system that can be adapted to an exposure apparatus that uses x-rays as the exposure light, for example, in the specification of U.S. Pat. No. 5,686,728 and in the specification of U.S. Pat. No. 6,710,917.

In a conventional 8-mirror reflecting type optical system described in the above patents, the width dimension (dimension along the radial direction of a circle centering on the optical axis) of an arcuate effective image forming region (a region in which, at the image surface, aberration has been corrected to the desired status) on the image surface is a maximum of approximately 2 mm. When the width dimension of the arcuate effective image forming region is small (narrow), light from the light source converges in that narrow region, so there are problems in that the temperature of that region increases, and warping attributable to this rise in temperature occurs.

In addition, when the width dimension of the arcuate effective image forming region is small, the ranges of the light beams that are reflected by the respective reflecting mirrors of the projection optical system also become relatively narrow, so there is a possibility that thermal warping of the respective reflecting mirrors will also become a problem. In particular, to the extent that the intensity of the light that emerges from the light source is strengthened in order to improve throughput, this problem becomes marked, and there is also a possibility that the projection optical system will no longer be able to achieve the desired performance due to an increase in temperature during exposure.

SUMMARY OF THE INVENTION

The present invention was devised taking the aforementioned problems into account. In an 8-mirror reflecting type projection optical system, for example, the width dimension of an arcuate effective image forming region is ensured to be relatively large. At the same time, the projection optical systems maintains the desired performance. In addition, an exposure apparatus using the disclosed projection optical system may provide high resolving power using x-rays, for example, as the exposure light and perform high resolution projection exposure.

Provided is a projection optical system that comprises eight reflecting mirrors and forms a reduced image of a first surface on a second surface. A first reflecting image forming optical system forms an intermediate image of the first surface, and a second reflecting image forming optical system forms an image of the intermediate image on the second surface. The first reflecting image forming optical system has a first reflecting mirror M1, a second reflecting mirror M2, a third reflecting mirror M3, and a fourth reflecting mirror M4 in order of incidence of light from the first surface side. The second reflecting image forming optical system has a fifth reflecting mirror M5, a sixth reflecting mirror M6, a seventh reflecting mirror M7, and an eighth reflecting mirror M8 in order of incidence of light from the first surface side. The first reflecting mirror M1, the fourth reflecting mirror M4, the fifth reflecting mirror M5, and the eighth reflecting mirror M8 have concave reflecting surfaces. The seventh reflecting mirror M7 has a convex reflecting surface. One of the reflecting mirrors from among the second reflecting mirror M2 and the third reflecting mirror M3 has a concave reflecting surface, and the other reflecting mirror has a convex reflecting surface, and when the distance between the optical axis and the center of the arcuate effective image forming region formed on the second surface is Yc, and the width dimension of the effective image forming region along a direction that connects the optical axis and the center of the effective image forming region is Dw, the condition $0.06 < Dw/Yc$ is satisfied.

Provided is a projection optical system that comprises eight reflecting mirrors and forms a reduced image of a first surface on a second surface. A first reflecting image forming optical system forms an intermediate image of the first surface, and a second reflecting image forming optical system forms an image of the intermediate image on the second surface. The first reflecting image forming optical system has a first reflecting mirror M1, a second reflecting mirror M2, a third reflecting mirror M3, and a fourth reflecting mirror M4 in order of incidence of light from the first surface side. The second reflecting image forming optical system has a fifth reflecting mirror M5, a sixth reflecting mirror M6, a seventh reflecting mirror M7, and an eighth reflecting mirror M8 in order of incidence of light from the first surface side. The first reflecting mirror M1, the fourth reflecting mirror M4, the fifth reflecting mirror M5, and the eighth reflecting mirror M8 have concave reflecting surfaces. The sixth reflecting mirror M6 and the seventh reflecting mirror M7 have convex reflecting surfaces, and one of the reflecting mirrors from among the second reflecting mirror M2 and the third reflecting mirror M3 has a concave reflecting surface, and the other reflecting mirror has a convex reflecting surface.

Also, provided is an exposure apparatus comprising an illumination system for illuminating a mask on the first surface and a projection optical system as already described for projecting the pattern of the mask onto a photosensitive substrate on the second surface.

Also provided is a device manufacturing method comprising an exposure process that uses the exposure apparatus already described to expose the pattern of the mask on the photosensitive substrate and a development process that develops the photosensitive substrate exposed by the exposure process.

In the described projection optical system, in a two times image forming type reflection optical system that comprises a first reflecting image forming optical system G1 that has four reflecting mirrors and a second reflecting image forming optical system G2 that has four reflecting mirrors, the configuration is such that the width dimension of the arcuate effective image forming region formed on the image plane (second surface) satisfies the prescribed conditional expression. As a result, in the described projection optical system, the width dimension of the arcuate effective image forming region is ensured to be relatively large. It is possible to maintain the desired performance even during exposure when adapted to an exposure apparatus, and it is possible to ensure that the effective amount of exposure is relatively large.

By adapting the projection optical system to an exposure apparatus, it is possible to use x-rays as the exposure light. In this case, the mask and the photosensitive substrate are moved relative to the projection optical system to perform projection exposure of the pattern of the mask onto the photosensitive substrate at high resolution and high throughput. As a result, it is possible to manufacture high precision micro devices at high throughput under good exposure conditions using a scanning type exposure apparatus that has high resolving power.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments.

DESCRIPTION OF THE PREFERRED EMBODIMENTS

Figure 1:
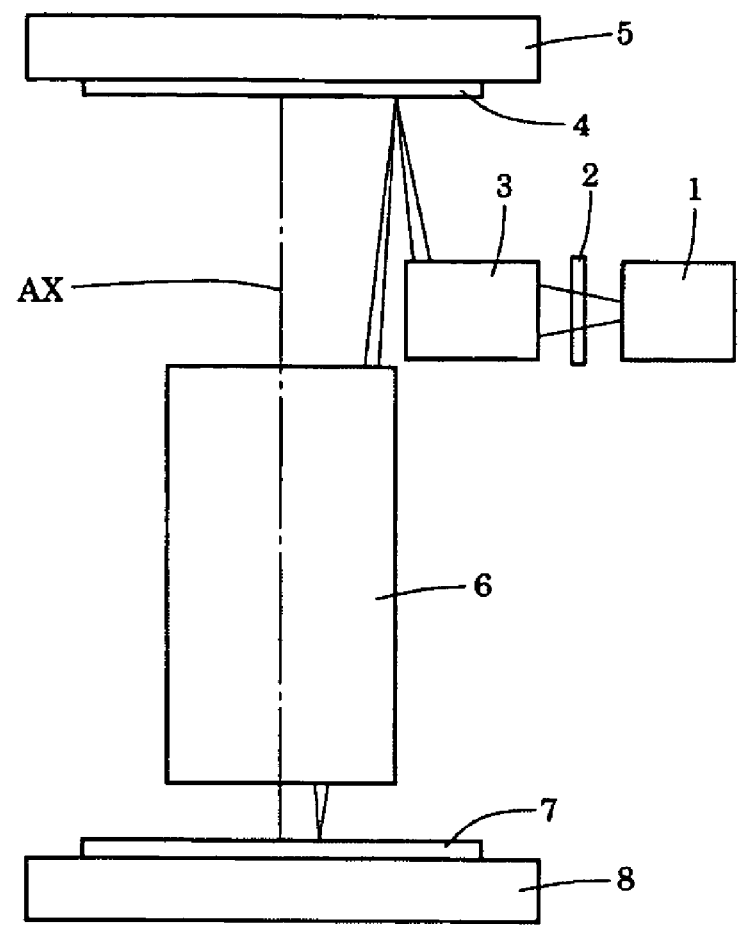
FIG. 1 schematically shows the configuration of an exposure apparatus relating to an embodiment of the present invention.

Reference will now be made in detail to the present preferred embodiments of the invention, examples of which are illustrated in the accompanying drawings. Wherever possible, the same reference numbers will be used throughout the drawings to refer to the same or like parts.

In a projection optical system, light from a first surface (object plane) forms an intermediate image of the first surface via a first reflecting image forming optical system G1. Then, the light from the intermediate image of the first surface formed via the first reflecting image forming optical system G1 forms an image of the intermediate image (reduced image of the first surface) on a second surface (image plane) via a second reflecting image forming optical system G2. Specifically, the intermediate image of the first surface is formed in the optical path between the first reflecting image forming optical system G1 and the second reflecting image forming optical system G2.

The first reflecting image forming optical system G1 comprises a first reflecting mirror M1 for reflecting light from the first surface, a second reflecting mirror M2 for reflecting light reflected by the first reflecting mirror M1, a third reflecting mirror M3 for reflecting light reflected by the second reflecting mirror M2, and a fourth reflecting mirror M4 for reflecting light reflected by the third reflecting mirror M3. In addition, the second reflecting image forming optical system G2 comprises a fifth reflecting mirror M5 for reflecting light from the intermediate image, a sixth reflecting mirror M6 for reflecting light reflected by the fifth reflecting mirror M5, a seventh reflecting mirror M7 for reflecting light reflected by the sixth reflecting mirror M6, and an eighth reflecting mirror M8 for reflecting light reflected by the seventh reflecting mirror M7.

Specifically, the first reflecting mirror M1, the fourth reflecting mirror M4, the fifth reflecting mirror M5 and the eighth reflecting mirror M8 have concave reflecting surfaces. The seventh reflecting mirror M7 has a convex reflecting surface. One of the reflecting mirrors from among the second reflecting mirror M2 and the third reflecting mirror M3 has a concave reflecting surface, and the other reflecting mirror has a convex reflecting surface. The sixth reflecting mirror M6 has a concave or convex reflecting surface. As a result, the first reflecting image forming optical system G1 has only one convex reflecting surface, and the second reflecting image forming optical system G2 has one or two convex reflecting surfaces.

Aberration occurs in relatively large amounts when the number of convex reflecting surfaces included in the image forming optical system is large, so the number of concave reflecting surfaces included in the first reflecting image forming optical system G1 is limited to 1, which is the minimum, (a minimum of one convex reflecting surface is necessary for image formation or for Petzval's sum to approach zero). Note that, in a reduced projection type optical system, a second reflecting image forming optical system G2 arranged near the image plane has more spreading of the light rays (the light beam NA is larger) than the first reflecting image forming optical system G1. Therefore, in the second reflecting image forming optical system G2, it is permissible to have a maximum of two convex reflecting surfaces from the standpoint of it being necessary to mutually separate light beams reflected by the respective reflecting mirrors.

Based on an 8-mirror reflecting type basic configuration and power arrangement such as that discussed above, it is thus possible to ensure a relatively large width dimension of the arcuate effective image forming region formed on the second surface. In addition, the intermediate image is formed in the optical path between the fourth reflecting mirror M4 and the fifth reflecting mirror M5 so that the balance between the first reflecting image forming optical system G1 and the second reflecting image forming optical system G2 becomes better. In this case, it is possible to use four reflecting mirrors to correct aberration in the second reflecting image forming optical system G2, and correction of aberration is easy. As a result, it is possible to ensure a relatively large width dimension of the effective image forming region, and it is possible to correct aberration well over a broad effective image forming region.

Specifically, in the projection optical system in an 8-mirror reflecting type basic configuration such as that discussed above, Conditional Expression (1) below is satisfied. In Conditional Expression (1), Yc is the distance between the optical axis and the center of the arcuate effective image forming region formed on the second surface (region in which aberration is corrected to the desired status in the image plane), and Dw is the width dimension of the effective image forming region along a direction that joins the optical axis and the center of the arcuate effective image forming region.

$$0.06 < Dw/Yc \tag{1}$$

If Dw/Yc falls below the lower limit value of Conditional Expression (1), then the width dimension Dw of the arcuate effective image forming region becomes too small, which makes it very difficult to maintain the desired performance during exposure if the projection optical system is adapted to an exposure apparatus. In other words, in the 8-mirror reflecting type projection optical system, Conditional Expression [1] is satisfied, so it is possible to ensure a relatively large width dimension of the arcuate effective image forming region (effective exposure region; static exposure region) when adapted to an exposure apparatus, and, in turn, it is possible to maintain the desired performance even during exposure.

In addition, by adapting the projection optical system to an exposure apparatus, it is possible to use x-rays as the exposure light. In this case, the mask and the photosensitive substrate are moved relative to the projection optical system to perform and high-resolution projection exposure of the mask pattern onto the photosensitive substrate. As a result, it is possible to use a scanning type exposure apparatus that has high resolving power to manufacture high precision micro devices under good exposure conditions.

To maintain the desired performance even during exposure when adapted to an exposure apparatus, it is preferable that Conditional Expressions (1A)~(1F) below is satisfied according to the value of the image side numerical aperture NA. Specifically, it is preferable that the image side numerical aperture NA is larger than 0.15 and that Conditional Expression (1A) below is satisfied.

$$0.064 < Dw/Yc \tag{1A}$$

Or, it is preferable that the image side numerical aperture NA is larger than 0.35 and not larger than 0.55 and that Conditional Expression (1B) below is satisfied.

$$0.06 < Dw/Yc < 0.2 \tag{1B}$$

In this case, it is more preferable that the image side numerical aperture NA is larger than 0.35 and smaller than 0.45 and that Conditional Expression (1C) below is satisfied.

$$0.064 < Dw/Yc\ 0.09 \tag{1C}$$

Or, it is preferable that the image side numerical aperture NA is larger than 0.3 and smaller than 0.4 and that Conditional Expression (1D) below is satisfied.

$$0.09 < Dw/Yc < 0.3 \tag{1D}$$

Or, it is preferable that the image side numerical aperture NA is larger than 0.25 and smaller than 0.35 and that Conditional Expression (1E) below is satisfied.

$$0.1 < Dw/Yc < 0.4 \tag{1E}$$

Or, it is preferable that the image side numerical aperture NA is larger than 0.15 and not larger than 0.25 and that Conditional Expression (1F) below is satisfied.

$$0.2 < Dw/Yc < 0.9 \tag{1F}$$

In Conditional Expression (1D), it is more preferable that the lower limit value of Dw/Yc is set to 0.13. In Conditional Expression (1E), it is more preferable that the lower limit value of Dw/Yc is set to 0.2. In Conditional Expression (1F), it is more preferable that the upper limit value of Dw/Yc be set to 0.8 and that the lower limit value is set to 0.3.

In addition, in the projection optical system, it is preferable that the sixth reflecting mirror M6 have a convex reflecting surface. In this case, the second reflecting image forming optical system G2 has two convex reflecting surfaces. As a result, it is possible to easily perform light beam separation at locations where the NA is large, and the designing of the optical system can be easier, so it is possible to correct aberration even if the width dimension Dw of the effective image forming region is ensured to be relatively large.

In addition, in the projection optical system, it is preferable that the sixth reflecting mirror M6 have a convex reflecting surface and that Conditional Expressions (1') and (2) below are satisfied. In Conditional Expression (2), R6 is the radius of curvature (vertex radius of curvature in the case of an aspheric surface) of the reflecting surface of the sixth reflecting mirror M6.

$$0.13 < Dw/Yc < 0.8 \tag{1'}$$

$$5.0 < |R6|/Yc < 50.0 \tag{2}$$

If Dw/Yc falls below the lower limit value of Conditional Expression (1'), then the width dimension Dw of the arcuate effective image forming region becomes too small, which makes it difficult to maintain the desired performance during exposure when the projection optical system is adapted to an exposure apparatus. On the other hand, if the upper limit value of Conditional Expression (1') is exceeded, then the width dimension Dw of the arcuate effective image forming region becomes large, making the light beams spread out too much and interfere with each other, and it becomes difficult to configure an optical system.

In other words, when the sixth reflecting mirror M6 has a convex reflecting surface in the 8-mirror reflecting type projection optical system satisfying Conditional Expression (1'), it is possible to ensure a relatively large width dimension of the arcuate effective image forming region (effective exposure region; static exposure region) when adapted to an exposure apparatus, and, in turn, it is possible to maintain the desired performance even during exposure.

In addition, if |R6|/Yc falls below the lower limit value of Conditional Expression (2), then the absolute value of the radius of curvature R6 of the reflecting surface of the sixth reflecting mirror M6 becomes too small, making large aberration likely to occur due to the sixth reflecting mirror M6, there is a possibility that the amount of occurrence thereof will become an amount that cannot be offset by the other reflecting mirrors, and there is a possibility that residual aberration will occur and cause image formation performance to deteriorate, so it is not preferable. On the other hand, if the upper limit value of Conditional Expression (2) is exceeded, then the absolute value of the radius of curvature R6 of the reflecting surface of the sixth reflecting mirror M6 becomes too large, making the light beams reflected by this sixth reflecting mirror M6 likely to stack up, and there is a possibility that it will be no longer possible to ensure a large width dimension Dw of the effective image forming region, so it is not preferable.

In the projection optical system, when the sixth reflecting mirror M6 has a convex reflecting surface and Conditional Expression (1') and Conditional Expression (2) are satisfied, to ensure even better image forming performance and to ensure that the width dimension Dw of the effective image forming region is even larger, it is preferable that Conditional Expression (2A) below is satisfied.

$$8.0 < |R6|/Yc < 15.0 \quad (2A)$$

Also, in the projection optical system, when the sixth reflecting mirror M6 has a convex reflecting surface and Conditional Expression (1') and Conditional Expression (2) or (2A) are satisfied, to further improve performance during exposure and to ensure an even larger effective exposure quantity of light when adapted to an exposure apparatus, it is preferable that Conditional Expressions (1'D)~(1'F) below are satisfied according to the value of the image side numerical aperture NA.

Specifically, it is preferable that the image side numerical aperture NA is larger than 0.3 and smaller than 0.4 and that Conditional Expression (1'D) below is satisfied.

$$0.13 < Dw/Yc < 0.3 \quad (1'D)$$

Or, it is preferable that the image side numerical aperture NA is larger than 0.25 and smaller than 0.35 and that Conditional Expression (1'E) below is satisfied.

$$0.2 < Dw/Yc < 0.4 \quad (1'E)$$

Or, it is preferable that the image side numerical aperture NA is larger than 0.15 and not larger than 0.25 and that Conditional Expression (1'F) below is satisfied.

$$0.3 < Dw/Yc < 0.8 \quad (1'F)$$

In the projection optical system, to further improve performance even during exposure when adapted to an exposure apparatus, it is preferable that the width dimension Dw of the arcuate effective image forming region is 2.5 mm or more.

In addition, in the projection optical system, it is preferable that Conditional Expression (3) below is satisfied. In Conditional Expression (3), H0 is the maximum object height at the first surface, and $M\phi$ is the maximum value of the effective radii of the eight reflecting mirrors M1~M8 (that is, the effective radius of the largest reflecting mirror)

$$0.5 < H0/M\phi \quad (3)$$

If H0/M$\phi$ falls below the lower limit value of Conditional Expression (3), then the effective radius M$\phi$ of the largest reflecting mirror becomes too large, causing the optical system to become larger in the radial direction, so it is not preferable. In other words, by satisfying Conditional Expression (3), it is possible to achieve a smaller reflecting mirror and, in turn, a smaller optical system, so the difficulty relating to manufacturing, such as in polishing, inspecting, and coating of the reflecting mirror, is reduced. In addition, the light ray reflection angles at the respective reflecting mirrors become smaller, so it is possible to achieve improvement in reflectivity and reduction of variation in reflectivity at the respective reflecting mirrors.

In addition, in the projection optical system, it is preferable that Conditional Expression (4) below is satisfied. In Conditional Expression (4), L12 is the axial interval between the reflecting surface nearest the second surface in the first reflecting image forming optical system G1 and the reflecting surface nearest the first surface in the second reflecting image forming optical system G2, and TL is the axial interval (that is, the object-to-image distance) between the first surface and the second surface.

$$0.1 < L12/TL < 0.7 \quad (4)$$

If L12/TL falls below the lower limit value of Conditional Expression (4), then the axial interval L12 between the first reflecting image forming optical system G1 and the second reflecting image forming optical system G2 becomes too small, which makes it difficult to form an intermediate image in the optical path between the first reflecting image forming optical system G1 and the second reflecting image forming optical system G2, so it is not preferable. It is further preferable that the lower limit value of Conditional Expression (4) is set to 0.15 and that the upper limit value is set to 0.5.

Also, in the projection optical system, it is preferable that all eight of the reflecting mirrors M1~M8 have reflecting surfaces formed in an aspheric shape. By introducing an aspheric surface in this way, it is possible to correct aberration and improve optical performance. It is also preferable that the reflecting surfaces of the respective reflecting mirrors be formed in a rotationally symmetrical aspheric shape in relation to the optical axis and that the maximum order of the aspheric surfaces that define the respective reflecting surfaces be of the $10^{th}$ order or higher.

Also, in the projection optical system, it is preferable that an aperture stop be provided on the reflecting surface of the second reflecting mirror M2 (specifically, at a position that comes into contact with the reflecting surface of the second reflecting mirror M2 or immediately before same) This configuration is advantageous in ensuring a large image side numerical aperture NA. Through this aperture stop, it is possible to restrict the light beam to the preferred size, so it is possible to perform adjustment of the quantity of light and adjustment of the depth of focus and the depth of field of the second surface (image plane).

Also, in the projection optical system, it is preferable that Conditional Expression (5) below be satisfied. In Conditional Expression (5), M$\phi$4 is the effective radius of the fourth reflecting mirror M4, which is arranged first in sequence from the intermediate image to the first surface side, and M$\phi$5 is the effective radius of the fifth reflecting mirror M5, which is arranged first in sequence from the intermediate image to the second surface side.

$$0.85 < M\phi 4/M\phi 5 < 1.2 \quad (5)$$

By satisfying Conditional Expression (5), specifically, by causing the ratio of the effective radius of the first-in-sequence fourth reflecting mirror M4 from the intermediate image toward the first surface side and the first-in-sequence fifth reflecting mirror M5 from the intermediate image to the second surface side to approach 1, the balance between the first reflecting image forming optical system G1 and the second reflecting image forming optical system G2 improves, and correction of aberration becomes easy, so it is preferable. In addition, when the effective radius of one reflecting mirror is made smaller, there is a tendency for the effective radius of the other reflecting mirror to become larger, so it is possible to prevent either of M4 or M5 from becoming relatively larger by causing the ratio of the effective radius of two reflecting mirrors to approach 1. Therefore, it is possible to configure the respective reflecting mirrors to be compact overall, and manufacturing of the respective reflecting mirrors also becomes easy. In particular, the fourth reflecting mirror M4 and the fifth reflecting mirror M5 tend to become relatively larger in the radial direction, so it is possible to easily implement shape measurement of the reflecting surfaces and processing of the reflecting surfaces by keeping the effective radii of these reflecting mirrors small.

In addition, it is preferable that the projection optical system be an optical system that is nearly telecentric on the image side (second surface side). Through this configuration, for example, when adapted to an exposure apparatus, good image formation is possible even if there is unevenness in the wafer within the depth of focus of the projection optical system.

Figure 2:
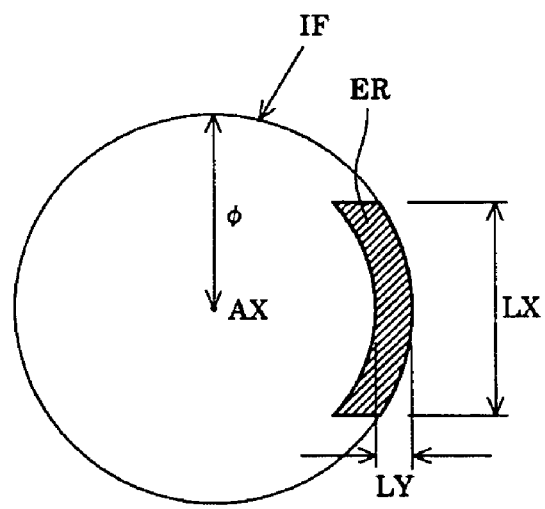
FIG. 2 shows the positional relationship between the optical axis and the arcuate effective image forming region formed on the wafer.
Figure 2:
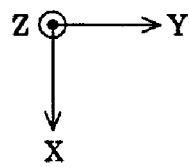

An embodiment of the present invention will be explained based on the attached drawings. FIG. 1 is a drawing that schematically shows the configuration of an exposure apparatus relating to an embodiment of the present invention. Also, FIG. 2 is a drawing that shows the positional relationship between the optical axis and the arcuate effective image forming region formed on the wafer. In FIG. 1, the Z axis is set up in the optical axis direction of the projection optical system, that is, along the direction of the normal line of the wafer, which is the photosensitive substrate, the Y axis is set up in a direction parallel to the page surface of FIG. 1 within the wafer plane, and the X axis is set up in a direction perpendicular to the page surface of FIG. 1 within the wafer plane.

The exposure apparatus of FIG. 1 comprises, for example, a laser plasma x-ray source 1 as the light source for supplying exposure light. The light that has emerged from the x-ray source 1 is incident to the illumination optical system 3 via a wavelength selection filter 2. Here, the wavelength selection filter 2 has characteristics such that it selectively allows only x-rays of a prescribed wavelength (13.5 nm) to pass from the light supplied by the x-ray source 1 and blocks the passage of light of other wavelengths. The x-rays that have passed through the wavelength selection filter 2 illuminate a reflecting type mask 4 on which the pattern to be transferred has been formed via an illumination optical system 3 configured by a plurality of reflecting mirrors.

The mask 4 is held by mask stage 5 that is able to move along the Y direction so that the pattern surface extends along the XY plane. In addition, the configuration is such that movement of the mask stage 5 is measured by a laser interferometer that is not shown in the drawing. An arcuate illumination region that is symmetrical with respect to the Y axis is formed on the mask 4. The light from the illuminated mask 4 forms the mask pattern image on the wafer 7, which is the photosensitive substrate, via a reflecting type projection optical system 6.

Specifically, as shown in FIG. 2, an arcuate effective image forming region that is symmetrical with respect to the Y axis is formed on the wafer 7. As shown in FIG. 2, within a circular region (image circle) IF having a radius $\phi$ with the optical axis AX as the center, an arcuate effective image forming region ER is set up, in which the length in the X direction is LX and the length in the Y direction is LY, so as to come into contact with this image circle IF. Here, the arcuate effective image forming region ER is a portion of a ring-shaped region having optical axis AX as its center, and the length LY is the width dimension of the effective image forming region ER along a direction that links the optical axis with the center of the arcuate effective image forming region ER.

The wafer 7 is held by a wafer stage 8 that is able to move two-dimensionally along the X direction and the Y direction so that the exposure surface thereof extends along the XY plane. Note that it is configured in such a way that movement of the wafer stage 8 is measured by a laser interferometer that is not shown in the drawing in the same way as the mask stage 5. In this way, the pattern of the mask 4 is transferred onto one exposure region of the wafer 7 by performing scan exposure while moving the mask stage 5 and the wafer stage 8 along the Y direction, that is, while relatively moving the mask 4 and the wafer 7 along the Y direction in relation to the projection optical system 6.

At this time, if the projection magnification (transfer magnification) of the projection optical system 6 is ¼, then the velocity of movement of the wafer stage 8 is set to ¼ the velocity of movement of the mask stage 5 to perform synchronous scanning. In addition, by repeating scanning exposure while two-dimensionally moving the wafer stage 8 along the X direction and the Y direction, the pattern of the mask 4 is sequentially transferred to the respective exposure regions of the wafer 7. The specific configuration of the projection optical system 6 will be explained below while referring to the first working example~sixth working example.

In the respective working examples, the projection optical system 6 comprises a first reflecting image forming optical system G1, which is for forming an intermediate image of the pattern of the mask 4, and a second reflecting image forming optical system G2, which is for forming an image of the intermediate image of the mask pattern (secondary image of the pattern of the mask 4). Specifically, the intermediate image of the mask pattern is formed in the optical path between the first reflecting image forming optical system G1 and the second reflecting image forming optical system G2. The first reflecting image forming optical system G1 comprises four reflecting mirrors M1~M4, and the second reflecting image forming optical system G2 comprises four reflecting mirrors M5~M8.

Note that, in the respective working examples, the reflecting surfaces of all of reflecting mirrors M1~M8 are formed in an aspheric shape that is rotationally symmetrical with respect to the optical axis. In addition, in the respective working examples, an aperture stop AS (not shown in the drawing) is provided on the reflecting surface of the second reflecting mirror M2 (specifically, at a position that comes into contact with the reflecting surface of the second reflecting mirror M2 or at a position in the vicinity thereof). In addition, in the respective working examples, the projection optical system 6 is an optical system that is nearly telecentric on the wafer side (image side).

In the respective working examples, the aspheric surface is expressed by the following equation (b) when y denotes the height in a direction perpendicular to the optical axis, z denotes the distance (amount of sag) along the optical axis from the tangential plane at the vertex of the aspheric surface to a position on the aspheric surface at height y, r denotes the vertex radius of curvature, κ denotes the conic coefficient, and $C_n$ denotes the $n^{th}$ order aspheric surface coefficient.

$$z = (y^2/r)/\{1 + \{1-(1+\kappa)\cdot y^2/r^2\}^{1/2}\} + \qquad (b)$$
$$C_4 \cdot y^4 + C_6 \cdot y^6 + C_8 \cdot y^8 + C_{10} \cdot y^{10} + \ldots$$

FIRST WORKING EXAMPLE

Figure 3:
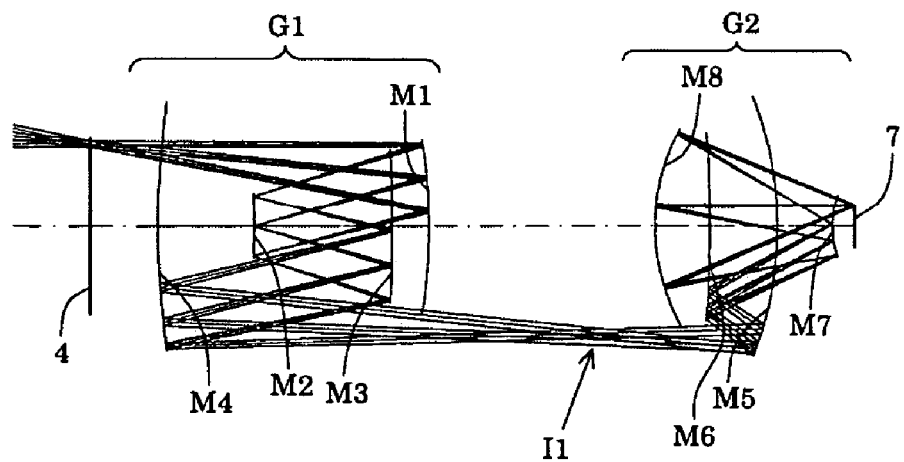
FIG. 3 shows the configuration of a projection optical system relating to the first working example of the present embodiment.

FIG. 3 is a drawing that shows the configuration of a projection optical system relating to the first working example of the present embodiment. Referring to FIG. 3, in the projection optical system of the first working example, the light from the mask 4 forms an intermediate image I1 of the mask pattern after being sequentially reflected by the concave reflecting surface of the first reflecting mirror M1, the convex reflecting surface of the second reflecting mirror M2, the concave reflecting surface of the third reflecting mirror M3, and the concave reflecting surface of the fourth reflecting mirror M4. The light from the mask pattern intermediate image I1 formed via the first reflecting image forming optical system GI forms a reduced image of the mask pattern (secondary image) of the mask pattern on the wafer after being sequentially reflected by the concave reflecting surface of the fifth reflecting mirror M5, the convex reflecting surface of the sixth reflecting mirror M6, the convex reflecting surface of the seventh reflecting mirror M7, and the concave reflecting surface of the eighth reflecting mirror M8.

Table (1) below presents the values of the specifications of the projection optical system relating to the first working example. In the main specifications section of Table (1), λ denotes the wavelength of the exposure light, β denotes the projection magnification, NA denotes the image side (wafer side) numerical aperture, H0 denotes the maximum object height on the mask 4, φ denotes the radius (maximum image height) of the image circle IF on the wafer 7, LX denotes the dimensions of the effective image forming region ER along the X direction, and LY denotes the dimensions (width dimension Dw) of the effective image forming region ER along the Y direction. In addition, in the conditional expression corresponding values section of Table (1), Dw denotes width dimension of the effective image forming region ER, Yc denotes the distance between the optical axis and the center of the effective image forming region ER, Mφ denotes the effective radius of the largest reflecting mirror, L12 denotes the axial interval between the reflecting surface nearest the wafer 7 in the first reflecting image forming optical system G1 and the reflecting surface nearest the mask 4 in the second reflecting image forming optical system G2 (specifically, the length measured along the axis indicated by the dashed line of FIG. 3), TL denotes the axial interval between the mask 4 and the wafer, Mφ4 denotes the effective radius of the fourth reflecting mirror M4, and Mφ5 denotes the effective radius of the fifth reflecting mirror M5.

In addition, the surface number denotes the sequence of reflecting surfaces from the mask side along a direction in which the light ray progresses from the mask surface, which is the object surface, to the wafer surface, which is the image surface, r denotes the vertex radii of curvature (mm) of the respective reflecting surfaces, and d denotes the axial intervals (mm), that is, the surface intervals (mm), of the respective reflecting surfaces. Note that the code of the surface interval d is changed each time it is reflected. In addition, regardless of the direction of incidence of the light ray, facing the mask side, the radius of curvature of the convex surface is considered to be positive, and the radius of curvature of the concave surface is considered to be negative. The aforementioned notation is also the same in Table (2)~Table (6) below.

TABLE (1)

(Main Specifications)

λ = 13.5 nm
β = ¼
NA = 0.40
H0 = 162 mm
φ = 40.5 mm
LX = 26 mm
LY = 3 mm (Optical Member Specifications)

| Surface Number | r | d | |
|---|---|---|---|
| | (Mask surface) | 614.28 | |
| 1 | −1046.58 | −320.59 | (First reflecting mirror M1) |
| | ∞ | 0.00 | (Aperture stop AS) |
| 2 | −2359.60 | 252.14 | (Second reflecting mirror M2) |
| 3 | −6000.00 | −425.83 | (Third reflecting mirror M3) |
| 4 | 1536.42 | 1132.65 | (Fourth reflecting mirror M4) |
| 5 | −732.40 | −123.97 | (Fifth reflecting mirror M5) |
| 6 | −5896.50 | 223.97 | (Sixth reflecting mirror M6) |
| 7 | 186.82 | −323.97 | (Seventh reflecting mirror M7) |
| 8 | 385.69 | 363.97 | (Eighth reflecting mirror M8) |
| | (Wafer surface) | | |

(Aspheric Surface Data)

First surface

κ = 0.000000
$C_4 = -0.490353 \times 10^{-9}$    $C_6 = 0.187833 \times 10^{-13}$
$C_8 = -0.668369 \times 10^{-18}$    $C_{10} = 0.156078 \times 10^{-22}$
$C_{12} = -0.263090 \times 10^{-27}$    $C_{14} = 0.289428 \times 10^{-32}$
$C_{16} = -0.146699 \times 10^{-37}$ Second surface κ = 0.000000
$C_4 = -0.523095 \times 10^{-8}$    $C_6 = -0.792438 \times 10^{-13}$
$C_8 = -0.395537 \times 10^{-17}$    $C_{10} = 0.1446776 \times 10^{-20}$
$C_{12} = -0.442304 \times 10^{-24}$    $C_{14} = 0.656994 \times 10^{-28}$
$C_{16} = -0.375633 \times 10^{-32}$ Third surface κ = 0.000000
$C_4 = -0.345747 \times 10^{-8}$    $C_6 = 0.160234 \times 10^{-13}$
$C_8 = -0.812557 \times 10^{-19}$    $C_{10} = -0.405318 \times 10^{-23}$
$C_{12} = 0.251637 \times 10^{-27}$    $C_{14} = -0.643795 \times 10^{-32}$
$C_{16} = 0.636242 \times 10^{-37}$ Fourth surface κ = 0.000000
$C_4 = -0.509993 \times 10^{-9}$    $C_6 = -0.461373 \times 10^{-15}$
$C_8 = -0.558537 \times 10^{-19}$    $C_{10} = 0.135987 \times 10^{-23}$
$C_{12} = -0.229961 \times 10^{-28}$    $C_{14} = 0.207457 \times 10^{-33}$
$C_{16} = -0.784057 \times 10^{-39}$ TABLE (1)-continued Fifth surface $\kappa = 0.000000$
$C_4 = -0.877467 \times 10^{-9}$     $C_6 = 0.419330 \times 10^{-14}$
$C_8 = -0.522321 \times 10^{-18}$    $C_{10} = 0.191134 \times 10^{-22}$
$C_{12} = -0.339849 \times 10^{-27}$  $C_{14} = 0.305964 \times 10^{-32}$
$C_{16} = -0.112252 \times 10^{-37}$ Sixth surface $\kappa = 0.000000$
$C_4 = -0.486930 \times 10^{-8}$     $C_6 = 0.553011 \times 10^{-13}$
$C_8 = -0.497239 \times 10^{-18}$    $C_{10} = 0.254040 \times 10^{-23}$
$C_{12} = -0.718269 \times 10^{-28}$  $C_{14} = 0.424298 \times 10^{-32}$
$C_{16} = -0.641606 \times 10^{-37}$ Seventh surface $\kappa = 0.000000$
$C_4 = 0.176088 \times 10^{-7}$      $C_6 = -0.360246 \times 10^{-12}$
$C_8 = 0.370692 \times 10^{-15}$     $C_{10} = -0.278352 \times 10^{-19}$
$C_{12} = 0.309556 \times 10^{-23}$  $C_{14} = -0.277603 \times 10^{-28}$
$C_{16} = -0.221395 \times 10^{-31}$ Eighth surface $\kappa = 0.000000$
$C_4 = 0.747781 \times 10^{-10}$     $C_6 = 0.730980 \times 10^{-15}$
$C_8 = 0.332054 \times 10^{-20}$     $C_{10} = 0.126494 \times 10^{-24}$
$C_{12} = -0.273171 \times 10^{-29}$ $C_{14} = 0.536041 \times 10^{-34}$
$C_{16} = -0.379263 \times 10^{-39}$ (Conditional Expression Corresponding Values)

Dw = LY = 3 mm
Yc = φ-Dw/2 = 39 mm
|R6| = 5896.50 mm
Mφ = 237.56 mm (Largest at the fifth reflecting mirror M5)
L12 = 414.40 mm
TL = 1392.65 mm
Mφ4 = 227.84 mm
Mφ5 = 237.56 mm
(1) Dw/Yc = 0.077
(2) |R6|/Yc = 151.2 > 50.0
(3) H0/Mφ = 0.682
(4) L12/TL = 0.298
(5) Mφ4/Mφ5 = 0.959

Figure 4:
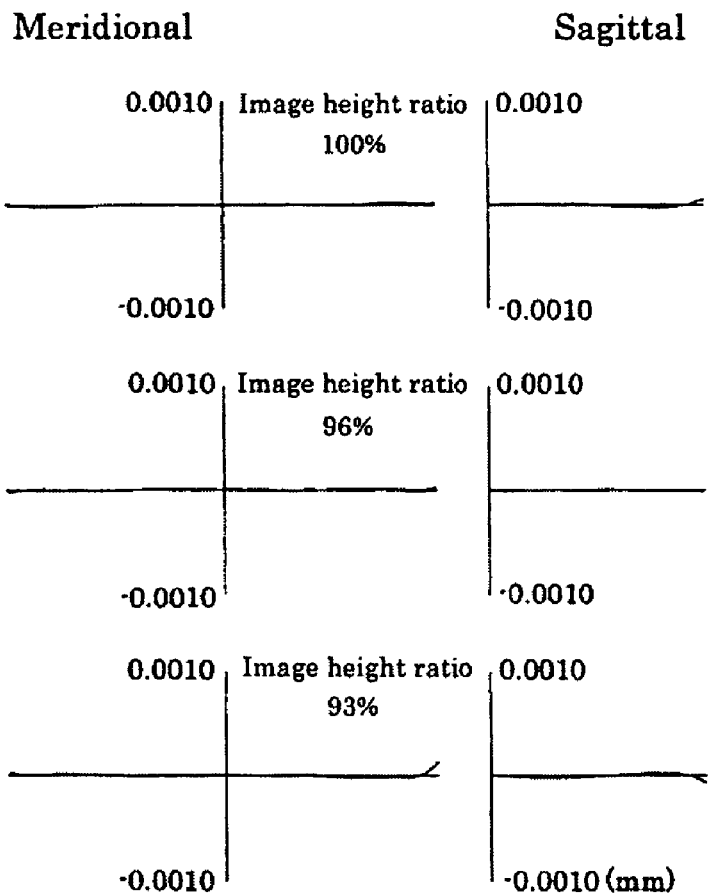
FIG. 4 shows coma aberration in the projection optical system of the first working example.

FIG. 4 is a drawing that shows coma aberration in the projection optical system of the first working example. FIG. 4 shows the meridional coma aberration and the sagittal coma aberration at image height ratio 100%, image height ratio 96% and image height ratio 93%. As is clear from the aberration diagram, in the first working example, it is understood that coma aberration is corrected well in the region that corresponds to the effective image forming region ER. In addition, though a drawing has been omitted, it has been confirmed that various aberrations other than coma aberration, such as spherical aberration and distortion, are also corrected well in the region that corresponds to the effective image forming region ER.

SECOND WORKING EXAMPLE

Figure 5:
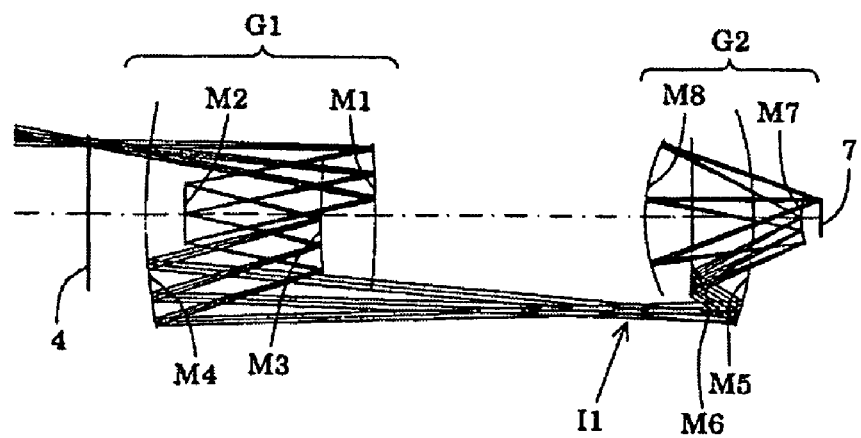
FIG. 5 shows the configuration of a projection optical system relating to the second working example of the present embodiment.

FIG. 5 is a drawing that shows the configuration of a projection optical system relating to the second working example of the present embodiment. Referring to FIG. 5, in the projection optical system of the second working example, the light from the mask 4 forms an intermediate image I1 of the mask pattern after being sequentially reflected by the concave reflecting surface of the first reflecting mirror M1, the concave reflecting surface of the second reflecting mirror M2, the convex reflecting surface of the third reflecting mirror M3, and the concave reflecting surface of the fourth reflecting mirror M4. Then, the light from the mask pattern intermediate image I1 formed via the first reflecting image forming optical system G1 forms a reduced image (secondary image) of the mask pattern on the wafer 7 after being sequentially reflected by the concave reflecting surface of the fifth reflecting mirror M5, the convex reflecting surface of the sixth reflecting mirror M6, the convex reflecting surface of the seventh reflecting mirror M7, and the concave reflecting surface of the eighth reflecting mirror M8. Table (2) below presents the values of the specifications of the projection optical system relating to the second working example.

TABLE (2)

(Main Specifications)

$\lambda = 13.5$ nm
$\beta = \frac{1}{4}$
NA = 0.35
H0 = 164 mm
φ = 41 mm
LX = 26 mm
LY = 4 mm (Optical Member Specifications)

| Surface Number | r | d | |
|---|---|---|---|
| 1 | (Mask surface) | 618.92 | |
| 1 | −1636.50 | −415.49 | (First reflecting mirror M1) |
| | ∞ | 0.00 | (Aperture stop AS) |
| 2 | 2528.81 | 295.36 | (Second reflecting mirror M2) |
| 3 | 1392.94 | −378.79 | (Third reflecting mirror M3) |
| 4 | 1236.53 | 1315.65 | (Fourth reflecting mirror M4) |
| 5 | −772.13 | −130.26 | (Fifth reflecting mirror M5) |
| 6 | −6000.00 | 232.08 | (Sixth reflecting mirror M6) |
| 7 | 202.38 | −332.08 | (Seventh reflecting mirror M7) |
| 8 | 395.89 | 372.08 | (Eighth reflecting mirror M8) |

(Wafer surface)

(Aspheric Surface Data)

First surface $\kappa = 0.000000$
$C_4 = -0.217127 \times 10^{-9}$     $C_6 = 0.393782 \times 10^{-14}$
$C_8 = -0.299814 \times 10^{-18}$    $C_{10} = 0.902223 \times 10^{-23}$
$C_{12} = -0.152035 \times 10^{-27}$  $C_{14} = 0.964488 \times 10^{-33}$
$C_{16} = 0.455030 \times 10^{-38}$ Second surface $\kappa = 0.000000$
$C_4 = -0.218946 \times 10^{-8}$     $C_6 = -0.126364 \times 10^{-13}$
$C_8 = -0.164756 \times 10^{-17}$    $C_{10} = 0.616260 \times 10^{-21}$
$C_{12} = -0.146840 \times 10^{-24}$  $C_{14} = 0.190021 \times 10^{-28}$
$C_{16} = -0.101697 \times 10^{-32}$ Third surface $\kappa = 0.000000$
$C_4 = -0.420438 \times 10^{-8}$     $C_6 = 0.171516 \times 10^{-13}$
$C_8 = -0.331765 \times 10^{-20}$    $C_{10} = -0.948704 \times 10^{-23}$
$C_{12} = 0.600014 \times 10^{-27}$  $C_{14} = -0.207904 \times 10^{-31}$
$C_{16} = 0.309146 \times 10^{-36}$ Fourth surface $\kappa = 0.000000$
$C_4 = -0.320214 \times 10^{-9}$     $C_6 = -0.872275 \times 10^{-15}$
$C_8 = 0.372560 \times 10^{-20}$     $C_{10} = -0.139110 \times 10^{-24}$
$C_{12} = 0.210288 \times 10^{-29}$  $C_{14} = -0.181824 \times 10^{-34}$
$C_{16} = 0.660041 \times 10^{-40}$ TABLE (2)-continued Fifth surface $\kappa = 0.000000$
$C_4 = -0.265916 \times 10^{-9}$    $C_6 = -0.498664 \times 10^{-14}$
$C_8 = -0.318509 \times 10^{-18}$   $C_{10} = 0.165506 \times 10^{-22}$
$C_{12} = -0.321621 \times 10^{-27}$ $C_{14} = 0.300988 \times 10^{-32}$
$C_{16} = -0.113223 \times 10^{-37}$ Sixth surface $\kappa = 0.000000$
$C_4 = -0.301025 \times 10^{-8}$    $C_6 = 0.519481 \times 10^{-13}$
$C_8 = -0.158462 \times 10^{-17}$   $C_{10} = 0.751265 \times 10^{-22}$
$C_{12} = -0.246106 \times 10^{-26}$ $C_{14} = 0.435279 \times 10^{-31}$
$C_{16} = -0.322162 \times 10^{-36}$ Seventh surface $\kappa = 0.000000$
$C_4 = 0.172901 \times 10^{-7}$     $C_6 = 0.115045 \times 10^{-11}$
$C_8 = 0.210667 \times 10^{-15}$    $C_{10} = -0.294788 \times 10^{-20}$
$C_{12} = -0.579816 \times 10^{-23}$ $C_{14} = 0.205736 \times 10^{-26}$
$C_{16} = -0.202972 \times 10^{-30}$ Eighth surface $\kappa = 0.000000$
$C_4 = 0.932327 \times 10^{-10}$    $C_6 = 0.769214 \times 10^{-15}$
$C_8 = 0.329356 \times 10^{-20}$    $C_{10} = 0.122723 \times 10^{-24}$
$C_{12} = -0.247447 \times 10^{-29}$ $C_{14} = 0.359947 \times 10^{-34}$
$C_{16} = -0.140188 \times 10^{-39}$ (Conditional Expression Corresponding Values)

Dw = LY = 4 mm
Yc = φ-Dw/2 = 39 mm
|R6| = 6000.00 mm
Mφ = 244.34 mm (Largest at the fourth reflecting mirror M4)
L12 = 586.47 mm
TL = 1577.47 mm
Mφ4 = 244.34 mm
Mφ5 = 231.99 mm
(1)Dw/Yc = 0.103
(2)|R6|/Yc = 153.8 > 50.0
(3)H0/Mφ = 0.671
(4)L12/TL = 0.372
(5)Mφ4/Mφ5 = 1.053

Figure 6:
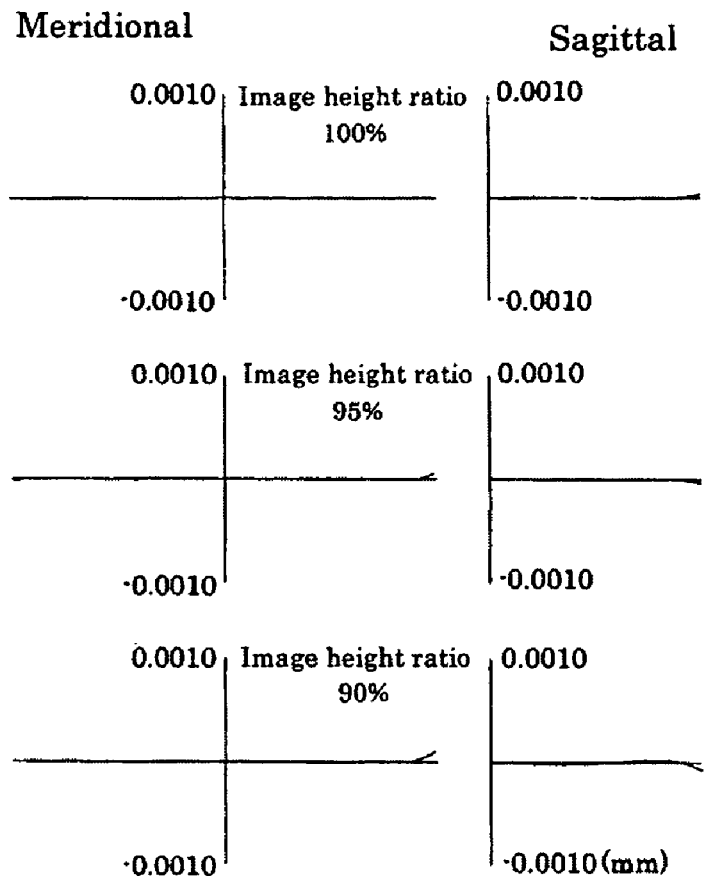
FIG. 6 shows coma aberration in the projection optical system of the second working example.

FIG. 6 is a drawing that shows coma aberration in the projection optical system of the second working example. FIG. 6 shows the meridional coma aberration and the sagittal coma aberration at image height ratio 100%, image height ratio 95% and image height ratio 90%. As is clear from the aberration diagram, it is understood that, in the second working example as well, coma aberration is corrected well in the region that corresponds to the effective image forming region ER in the same way as in the first working example. In addition, though a drawing has been omitted, it has been confirmed that various aberrations other than coma aberration, such as spherical aberration and distortion, are also corrected well in the region that corresponds to the effective image forming region ER.

THIRD WORKING EXAMPLE

Figure 7:
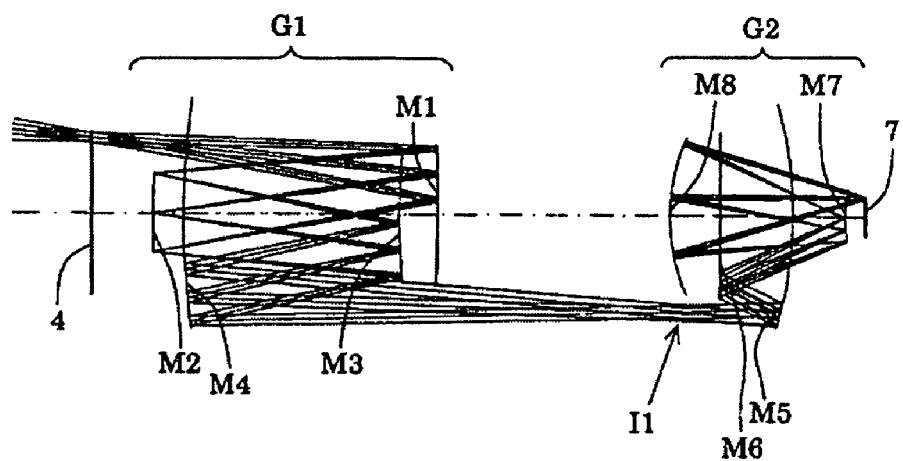
FIG. 7 shows the configuration of a projection optical system relating to the third working example of the present embodiment.

FIG. 7 is a drawing that shows the configuration of a projection optical system relating to the third working example of the present embodiment. Referring to FIG. 7, in the projection optical system of the third working example, the light from the mask 4 forms an intermediate image I1 of the mask pattern after being sequentially reflected by the concave reflecting surface of the first reflecting mirror M1, the concave reflecting surface of the second reflecting mirror M2, the convex reflecting surface of the third reflecting mirror M3, and the concave reflecting surface of the fourth reflecting mirror M4. The light from the mask pattern intermediate image I1 formed via the first reflecting image forming optical system G1 then forms a reduced image (secondary image) of the mask pattern on the wafer 7 after being sequentially reflected by the concave reflecting surface of the fifth reflecting mirror M5, the concave reflecting surface of the sixth reflecting mirror M6, the convex reflecting surface of the seventh reflecting mirror M7, and the concave reflecting surface of the eighth reflecting mirror M8. Table (3) below presents the values of the specifications of the projection optical system relating to the third working example.

TABLE (3)

(Main Specifications)

$\lambda = 13.5$ nm
$\beta = \frac{1}{4}$
NA = 0.30
H0 = 166 mm
φ = 41.5 mm
LX = 26 mm
LY = 5 mm (Optical Member Specifications)

| Surface Number | r | d | |
|---|---|---|---|
| | (Mask surface) | 690.17 | |
| 1 | −4096.57 | −570.17 | (First reflecting mirror M1) |
| | ∞ | 0.00 | (Aperture stop AS) |
| 2 | 1557.29 | 493.57 | (Second reflecting mirror M2) |
| 3 | 1542.00 | −433.57 | (Third reflecting mirror M3) |
| 4 | 1586.97 | 1223.25 | (Fourth reflecting mirror M4) |
| 5 | −896.28 | −145.92 | (Fifth reflecting mirror M5) |
| 6 | 40438.56 | 248.88 | (Sixth reflecting mirror M6) |
| 7 | 219.59 | −348.95 | (Seventh reflecting mirror M7) |
| 8 | 415.44 | 389.14 | (Eighth reflecting mirror M8) |
| | (Wafer surface) | | |

(Aspheric Surface Data)

First surface $\kappa = 0.000000$
$C_4 = -0.483330 \times 10^{-10}$   $C_6 = 0.573487 \times 10^{-15}$
$C_8 = -0.179244 \times 10^{-18}$   $C_{10} = 0.702134 \times 10^{-23}$
$C_{12} = -0.154388 \times 10^{-27}$ $C_{14} = 0.158340 \times 10^{-32}$
$C_{16} = -0.179820 \times 10^{-38}$ Second surface $\kappa = 0.000000$
$C_4 = -0.405093 \times 10^{-9}$    $C_6 = -0.127121 \times 10^{-14}$
$C_8 = -0.763009 \times 10^{-19}$   $C_{10} = 0.179769 \times 10^{-22}$
$C_{12} = -0.265344 \times 10^{-26}$ $C_{14} = 0.215606 \times 10^{-30}$
$C_{16} = -0.737322 \times 10^{-35}$ Third surface $\kappa = 0.000000$
$C_4 = -0.212738 \times 10^{-8}$    $C_6 = 0.475173 \times 10^{-14}$
$C_8 = 0.339618 \times 10^{-19}$    $C_{10} = -0.501477 \times 10^{-23}$
$C_{12} = 0.277906 \times 10^{-27}$ $C_{14} = -0.859567 \times 10^{-32}$
$C_{16} = 0.113488 \times 10^{-36}$ Fourth surface $\kappa = 0.000000$
$C_4 = -0.312683 \times 10^{-9}$    $C_6 = -0.758371 \times 10^{-15}$
$C_8 = 0.417824 \times 10^{-20}$    $C_{10} = -0.136254 \times 10^{-24}$
$C_{12} = 0.212228 \times 10^{-29}$ $C_{14} = -0.190100 \times 10^{-34}$
$C_{16} = 0.720404 \times 10^{-40}$ TABLE (3)-continued Fifth surface $\kappa = 0.000000$
$C_4 = -0.345169 \times 10^{-9}$     $C_6 = -0.135689 \times 10^{-14}$
$C_8 = -0.327372 \times 10^{-18}$    $C_{10} = 0.152106 \times 10^{-22}$
$C_{12} = -0.294901 \times 10^{-27}$  $C_{14} = 0.280270 \times 10^{-32}$
$C_{16} = -0.107465 \times 10^{-37}$ Sixth surface $\kappa = 0.000000$
$C_4 = -0.250967 \times 10^{-8}$     $C_6 = 0.679739 \times 10^{-13}$
$C_8 = -0.319316 \times 10^{-17}$    $C_{10} = 0.135706 \times 10^{-21}$
$C_{12} = -0.374881 \times 10^{-26}$  $C_{14} = 0.585595 \times 10^{-31}$
$C_{16} = -0.395032 \times 10^{-36}$ Seventh surface $\kappa = 0.000000$
$C_4 = 0.150624 \times 10^{-7}$      $C_6 = 0.991716 \times 10^{-12}$
$C_8 = 0.166338 \times 10^{-15}$     $C_{10} = -0.142668 \times 10^{-19}$
$C_{12} = -0.150178 \times 10^{-23}$  $C_{14} = 0.120639 \times 10^{-26}$
$C_{16} = -0.142962 \times 10^{-30}$ Eighth surface $\kappa = 0.000000$
$C_4 = 0.820008 \times 10^{-10}$     $C_6 = 0.613165 \times 10^{-15}$
$C_8 = 0.249928 \times 10^{-20}$     $C_{10} = 0.925818 \times 10^{-25}$
$C_{12} = -0.242147 \times 10^{-29}$  $C_{14} = 0.397522 \times 10^{-34}$
$C_{16} = -0.167577 \times 10^{-39}$ (Conditional Expression Corresponding Values)

Dw = LY = 5 mm
Yc = φ-Dw/2 = 39 mm
|R6| = 40438.56 mm
Mφ = 232.66 mm (Largest at the fourth reflecting mirror M4)
L12 = 467.08 mm
TL = 1546.39 mm
Mφ4 = 232.66 mm
Mφ5 = 226.90 mm
(1)Dw/Yc = 0.128
(2)|R6|/Yc = 1036.9 > 50.0
(3)H0/Mφ = 0.713
(4)L12/TL = 0.302
(5)Mφ4/Mφ5 = 1.025

Figure 8:
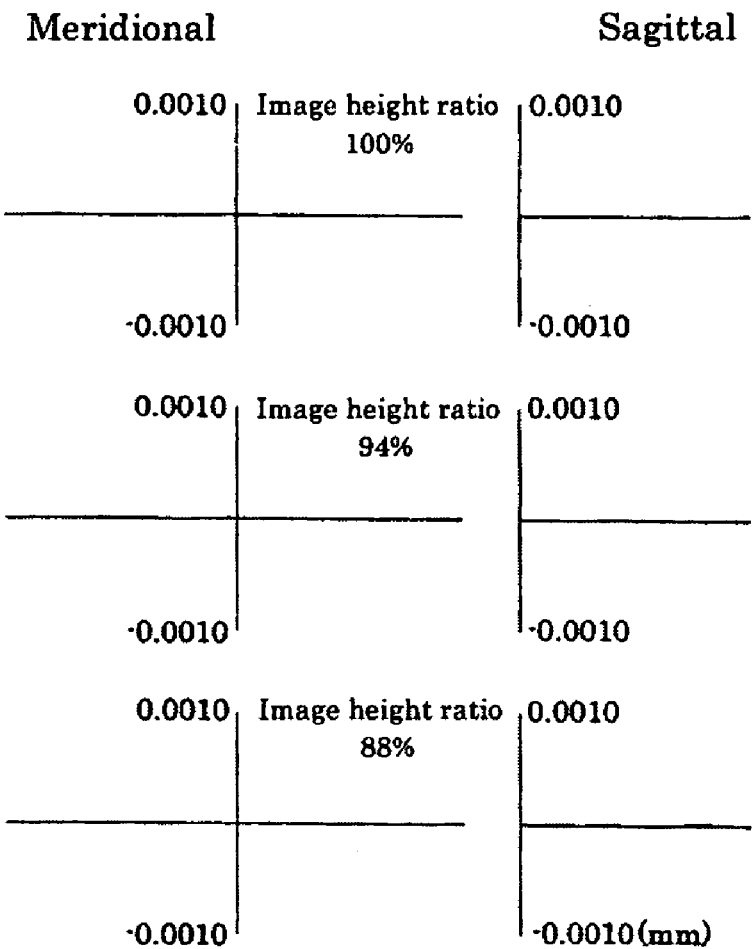
FIG. 8 shows coma aberration in the projection optical system of the third working example.

FIG. 8 is a drawing that shows coma aberration in the projection optical system of the third working example. FIG. 8 shows the meridional coma aberration and the sagittal coma aberration at image height ratio 100%, image height ratio 94% and image height ratio 88%. As is clear from the aberration diagram, it is understood that, in the third working example as well, coma aberration is corrected well in the region that corresponds to the effective image forming region ER in the same way as in the first working example and the second working example. In addition, though a drawing has been omitted, it has been confirmed that various aberrations other than coma aberration, such as spherical aberration and distortion, are also corrected well in the region that corresponds to the effective image forming region ER.

FOURTH WORKING EXAMPLE

Figure 9:
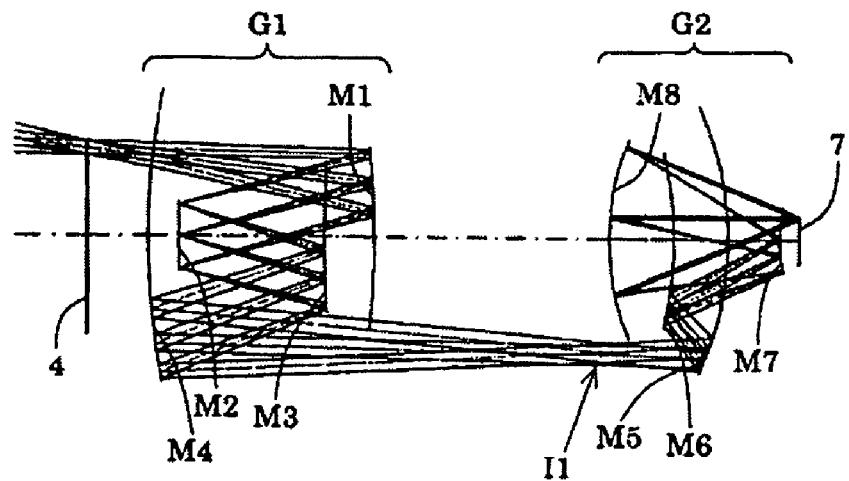
FIG. 9 shows the configuration of a projection optical system relating to the fourth working example of the present embodiment.

FIG. 9 is a drawing that shows the configuration of a projection optical system relating to the fourth working example of the present embodiment. Referring to FIG. 9, in the projection optical system of the fourth working example, the light from the mask 4 forms an intermediate image I1 of the mask pattern after being sequentially reflected by the concave reflecting surface of the first reflecting mirror M1, the concave reflecting surface of the second reflecting mirror M2, the convex reflecting surface of the third reflecting mirror M3, and the concave reflecting surface of the fourth reflecting mirror M4. Then, the light from the mask pattern intermediate image I1 formed via the first reflecting image forming optical system G1 forms a reduced image (secondary image) of the mask pattern on the wafer 7 after being sequentially reflected by the concave reflecting surface of the fifth reflecting mirror M5, the convex reflecting surface of the sixth reflecting mirror M6, the convex surface of the seventh reflecting mirror M7, and the concave reflecting surface of the eighth reflecting mirror M8. Table (4) below presents the values of the specifications of the projection optical system relating to the fourth working example.

TABLE (4)

(Main Specifications)

$\lambda = 13.5$ nm
$\beta = \frac{1}{4}$
NA = 0.35
H0 = 168 mm
φ = 42 mm
LX = 26 mm
LY = 6 mm (Optical Member Specifications)

| Surface Number | r | d | |
|---|---|---|---|
| | (Mask surface) | 574.44 | |
| 1 | −1438.09 | −393.01 | (First reflecting mirror M1) |
| | ∞ | 0.00 | (Aperture stop AS) |
| 2 | 3866.13 | 291.66 | (Second reflecting mirror M2) |
| 3 | 1472.75 | −353.10 | (Third reflecting mirror M3) |
| 4 | 1146.08 | 1160.96 | (Fourth reflecting mirror M4) |
| 5 | −482.14 | −106.78 | (Fifth reflecting mirror M5) |
| 6 | −544.10 | 208.88 | (Sixth reflecting mirror M6) |
| 7 | 258.86 | −338.06 | (Seventh reflecting mirror M7) |
| 8 | 403.16 | 378.06 | (Eighth reflecting mirror M8) |
| | (Wafer surface) | | |

(Aspheric Surface Data)

First surface $\kappa = 0.000000$
$C_4 = -0.480727 \times 10^{-9}$     $C_6 = 0.17145 \times 10^{-14}$
$C_8 = 0.519061 \times 10^{-19}$     $C_{10} = -0.200289 \times 10^{-23}$
$C_{12} = 0.388495 \times 10^{-28}$   $C_{14} = -0.403938 \times 10^{-33}$
$C_{16} = 0.200167 \times 10^{-38}$ Second surface $\kappa = 0.000000$
$C_4 = 0.255477 \times 10^{-8}$      $C_6 = 0.176224 \times 10^{-12}$
$C_8 = 0.590733 \times 10^{-17}$     $C_{10} = 0.117702 \times 10^{-20}$
$C_{12} = -0.292975 \times 10^{-24}$  $C_{14} = 0.576524 \times 10^{-28}$
$C_{16} = -0.425945 \times 10^{-32}$ Third surface $\kappa = 0.000000$
$C_4 = -0.352219 \times 10^{-8}$     $C_6 = 0.180042 \times 10^{-13}$
$C_8 = -0.187675 \times 10^{-18}$    $C_{10} = 0.567699 \times 10^{-23}$
$C_{12} = -0.207949 \times 10^{-27}$  $C_{14} = 0.338569 \times 10^{-32}$
$C_{16} = -0.115858 \times 10^{-37}$ Fourth surface $\kappa = 0.000000$
$C_4 = -0.283304 \times 10^{-9}$     $C_6 = -0.630992 \times 10^{-15}$
$C_8 = 0.197038 \times 10^{-20}$     $C_{10} = -0.745709 \times 10^{-25}$
$C_{12} = 0.997049 \times 10^{-30}$   $C_{14} = -0.713015 \times 10^{-35}$
$C_{16} = 0.192777 \times 10^{-40}$ TABLE (4)-continued Fifth surface $\kappa = 0.000000$
$C_4 = 0.816361 \times 10^{-9}$
$C_8 = 0.157393 \times 10^{-18}$
$C_{12} = 0.343787 \times 10^{-28}$
$C_{16} = 0.411332 \times 10^{-39}$
$C_6 = -0.304667 \times 10^{-14}$
$C_{10} = -0.295696 \times 10^{-23}$
$C_{14} = -0.199811 \times 10^{-33}$ Sixth surface $\kappa = 0.000000$
$C_4 = 0.447236 \times 10^{-8}$
$C_8 = -0.403434 \times 10^{-17}$
$C_{12} = -0.783799 \times 10^{-26}$
$C_{16} = -0.985105 \times 10^{-36}$
$C_6 = 0.135751 \times 10^{-13}$
$C_{10} = 0.240767 \times 10^{-21}$
$C_{14} = 0.136361 \times 10^{-30}$ Seventh surface $\kappa = 0.000000$
$C_4 = 0.463275 \times 10^{-7}$
$C_8 = 0.640137 \times 10^{-16}$
$C_{12} = 0.182305 \times 10^{-23}$
$C_{16} = 0.461146 \times 10^{-31}$
$C_6 = 159037 \times 10^{-11}$
$C_{10} = 0.779121 \times 10^{-20}$
$C_{14} = -0.403909 \times 10^{-27}$ Eighth surface $\kappa = 0.000000$
$C_4 = -0.214341 \times 10^{-10}$
$C_8 = -0.380405 \times 10^{-20}$
$C_{12} = 0.128527 \times 10^{-29}$
$C_{16} = 0.217037 \times 10^{-39}$
$C_6 = -0.379937 \times 10^{-15}$
$C_{10} = -0.953193 \times 10^{-25}$
$C_{14} = -0.361995 \times 10^{-34}$ (Conditional Expression Corresponding Values)

Dw = LY = 6 mm
Yc = φ-Dw/2 = 39 mm
|R6| = 544.10 mm
Mφ =252.45 mm (Largest at the fourth reflecting mirror M4)
L12 =470.56 mm
TL = 1423.06 mm
Mφ4 = 252.45 mm
Mφ5 = 229.97 mm
(1')Dw/Yc = 0.154
(2)|R6|/Yc = 13.95
(3)H0/Mφ = 0.665
(4)L12/TL = 0.331
(5)Mφ4/Mφ5 = 1.098

Figure 10:
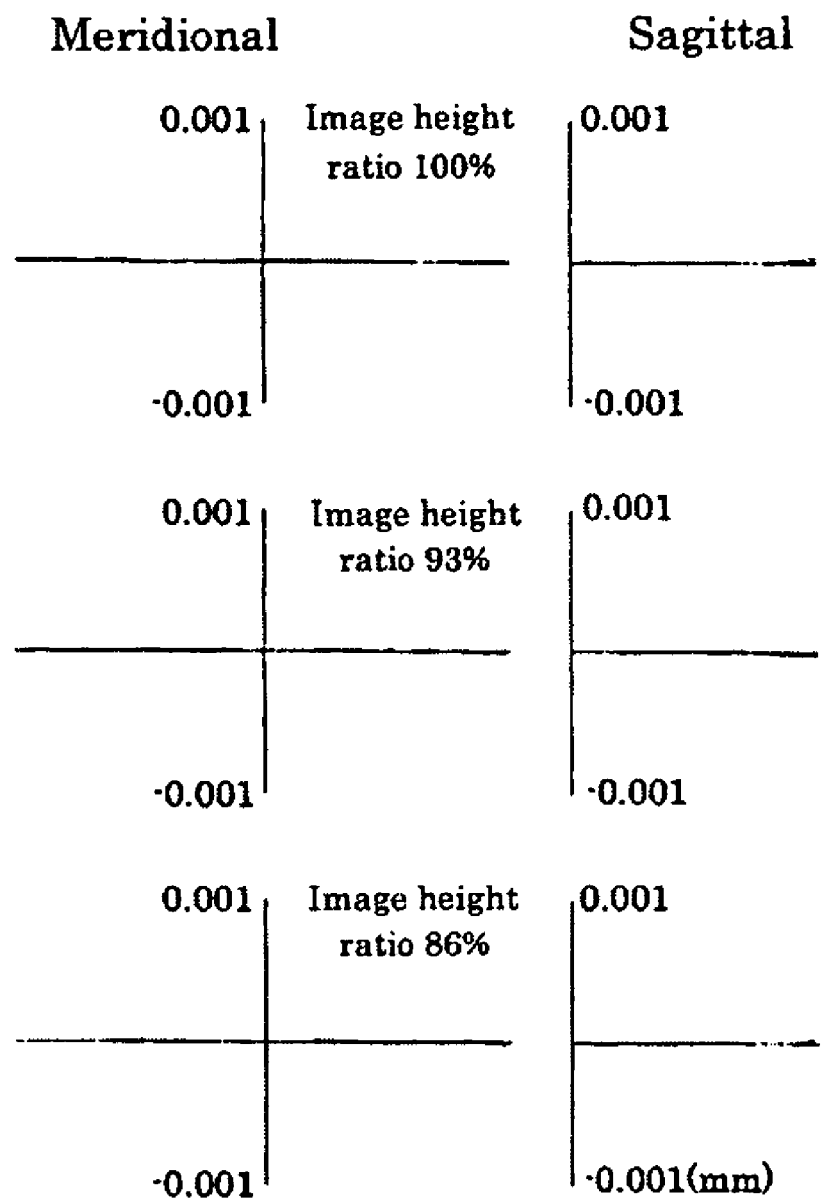
FIG. 10 shows coma aberration in the projection optical system of the fourth working example.

FIG. 10 is a drawing that shows coma aberration in the projection optical system of the fourth working example. FIG. 10 shows the meridional coma aberration and the sagittal coma aberration at image height ratio 100%, image height ratio 93% and image height ratio 86%. As is clear from the aberration diagram, it is understood that, in the fourth working example as well, coma aberration is corrected well in the region that corresponds to the effective image forming region ER in the same way as in the first working example~third working example. In addition, though a drawing has been omitted, it has been confirmed that various aberrations other than coma aberration, such as spherical aberration and distortion, are also corrected well in the region that corresponds to the effective image forming region ER.

FIFTH WORKING EXAMPLE

Figure 11:
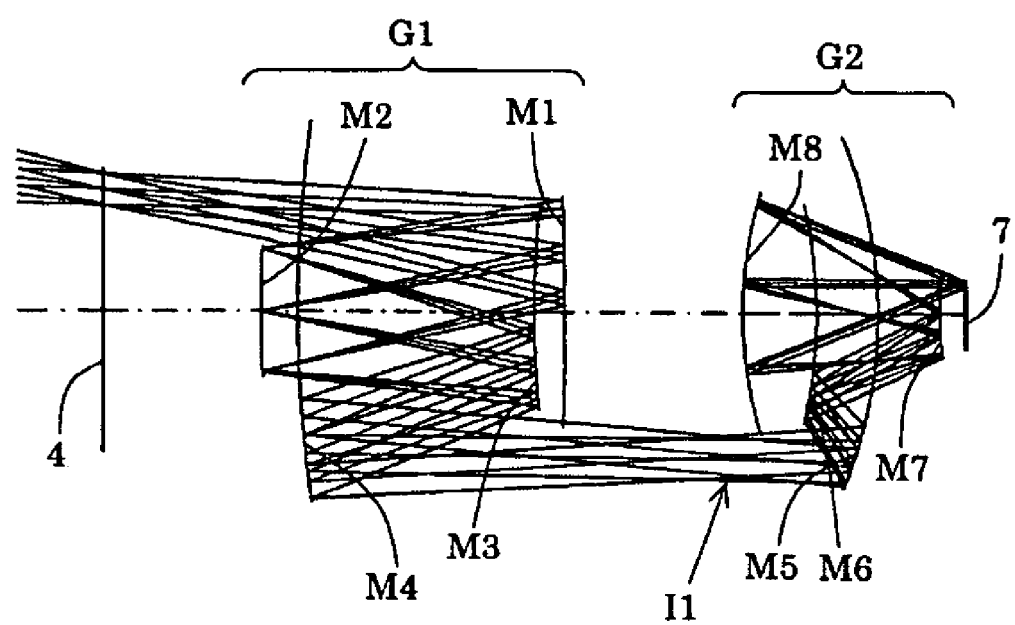
FIG. 11 shows the configuration of a projection optical system relating to the fifth working example of the present embodiment.

FIG. 11 is a drawing that shows the configuration of a projection optical system relating to the fifth working example of the present embodiment. Referring to FIG. 11, in the projection optical system of the fifth working example, the light from the mask 4 forms an intermediate image I1 of the mask pattern after being sequentially reflected by the concave reflecting surface of the first reflecting mirror M1, the concave reflecting surface of the second reflecting mirror M2, the convex reflecting surface of the third reflecting mirror M3, and the concave reflecting surface of the fourth reflecting mirror M4. Then, the light from the mask pattern intermediate image I1 formed via the first reflecting image forming optical system G1 forms a reduced image (secondary image) of the mask pattern on the wafer 7 after being sequentially reflected by the concave reflecting surface of the fifth reflecting mirror M5, the convex reflecting surface of the sixth reflecting mirror M6, the convex reflecting surface of the seventh reflecting mirror M7, and the concave reflecting surface of the eighth reflecting mirror M8. The values of the specifications of the projection optical system relating to the fifth working example are presented in Table (5) below.

TABLE (5)

(Main Specifications)

$\lambda = 13.5$ nm
$\beta = \frac{1}{4}$
NA = 0.3
H0 = 176 mm
φ = 44 mm
LX = 26 mm
LY = 10 mm (Optical Member Specifications)

| Surface Number | r | d | |
|---|---|---|---|
| | (Mask surface) | 760.23 | |
| 1 | −3240.17 | −503.13 | (First reflecting mirror M1) |
| | ∞ | 0.00 | (Aperture stop AS) |
| 2 | 1307.73 | 453.32 | (Second reflecting mirror M2) |
| 3 | 985.72 | −393.32 | (Third reflecting mirror M3) |
| 4 | 1230.44 | 958.91 | (Fourth reflecting mirror M4) |
| 5 | −448.68 | −100.12 | (Fifth reflecting mirror M5) |
| 6 | −449.21 | 200.12 | (Sixth reflecting mirror M6) |
| 7 | 295.16 | −322.82 | (Seventh reflecting mirror M7) |
| 8 | 396.16 | 362.82 | (Eighth reflecting mirror M8) |
| | (Wafer surface) | | |

(Aspheric Surface Data)

First surface $\kappa = 0.000000$
$C_4 = 0.336144 \times 10^{-9}$
$C_8 = 0.611653 \times 10^{-19}$
$C_{12} = 0.834293 \times 10^{-28}$
$C_{16} = 0.183215 \times 10^{-37}$
$C_6 = -0.183014 \times 10^{-14}$
$C_{10} = -0.236919 \times 10^{-23}$
$C_{14} = -0.186023 \times 10^{-32}$ Second surface $\kappa = 0.000000$
$C_4 = -0.184273 \times 10^{-9}$
$C_8 = -0.499580 \times 10^{-19}$
$C_{12} = -0.849953 \times 10^{-27}$
$C_{16} = -0.329935 \times 10^{-35}$
$C_6 = -0.272371 \times 10^{-14}$
$C_{10} = 0.394720 \times 10^{-23}$
$C_{14} = 0.836092 \times 10^{-31}$ Third surface $\kappa = 0.000000$
$C_4 = -0.243751 \times 10^{-8}$
$C_8 = -0.427509 \times 10^{-19}$
$C_{12} = 0.456330 \times 10^{-28}$
$C_{16} = 0.221022 \times 10^{-37}$
$C_6 = 0.685487 \times 10^{-14}$
$C_{10} = -0.799913 \times 10^{-24}$
$C_{14} = -0.157178 \times 10^{-32}$ Fourth surface $\kappa = 0.000000$
$C_4 = -0.327130 \times 10^{-9}$
$C_8 = -0.120344 \times 10^{-19}$
$C_{12} = -0.346399 \times 10^{-29}$
$C_{16} = -0.935974 \times 10^{-40}$
$C_6 = -0.558339 \times 10^{-15}$
$C_{10} = 0.232465 \times 10^{-24}$
$C_{14} = 0.270910 \times 10^{-34}$ TABLE (5)-continued Fifth surface $\kappa = 0.000000$
$C_4 = 0.553261 \times 10^{-9}$        $C_6 = 0.466315 \times 10^{-14}$
$C_8 = -0.589319 \times 10^{-19}$       $C_{10} = 0.100641 \times 10^{-23}$
$C_{12} = -0.760718 \times 10^{-29}$    $C_{14} = 0.353039 \times 10^{-34}$
$C_{16} = -0.922030 \times 10^{-40}$ Sixth surface $\kappa = 0.000000$
$C_4 = 0.410307 \times 10^{-8}$         $C_6 = -0.114627 \times 10^{-13}$
$C_8 = 0.629088 \times 10^{-18}$        $C_{10} = -0.885802 \times 10^{-22}$
$C_{12} = 0.614843 \times 10^{-26}$     $C_{14} = -0.200625 \times 10^{-30}$
$C_{16} = 0.322162 \times 10^{-35}$ Seventh surface $\kappa = 0.000000$
$C_4 = 0.127776 \times 10^{-7}$         $C_6 = 0.540836 \times 10^{-12}$
$C_8 = -0.454270 \times 10^{-16}$       $C_{10} = 0.178687 \times 10^{-19}$
$C_{12} = -0.561231 \times 10^{-23}$    $C_{14} = 0.945578 \times 10^{-27}$
$C_{16} = -0.699724 \times 10^{-31}$ Eighth surface $\kappa = 0.000000$
$C_4 = 0.120958 \times 10^{-9}$         $C_6 = 0.119111 \times 10^{-14}$
$C_8 = 0.102490 \times 10^{-19}$        $C_{10} = -0.827807 \times 10^{-25}$
$C_{12} = 0.946779 \times 10^{-29}$     $C_{14} = -0.273355 \times 10^{-33}$
$C_{16} = 0.338716 \times 10^{-38}$ (Conditional Expression Corresponding Values)

Dw = LY = 10 mm
Yc = φ-Dw/2 = 39 mm
|R6| = 449.21 mm
Mφ = 237.64 mm (Largest at the fourth reflecting mirror M4)
L12 = 292.95 mm
TL = 1416.00 mm
Mφ4 = 237.64 mm
Mφ5 = 218.50 mm
(1')Dw/Yc = 0.256
(2)|R6|/Yc = 11.52
(3)H0/Mφ = 0.741
(4)L12/TL = 0.207
(5)Mφ4/Mφ5 = 1.088

Figure 12:
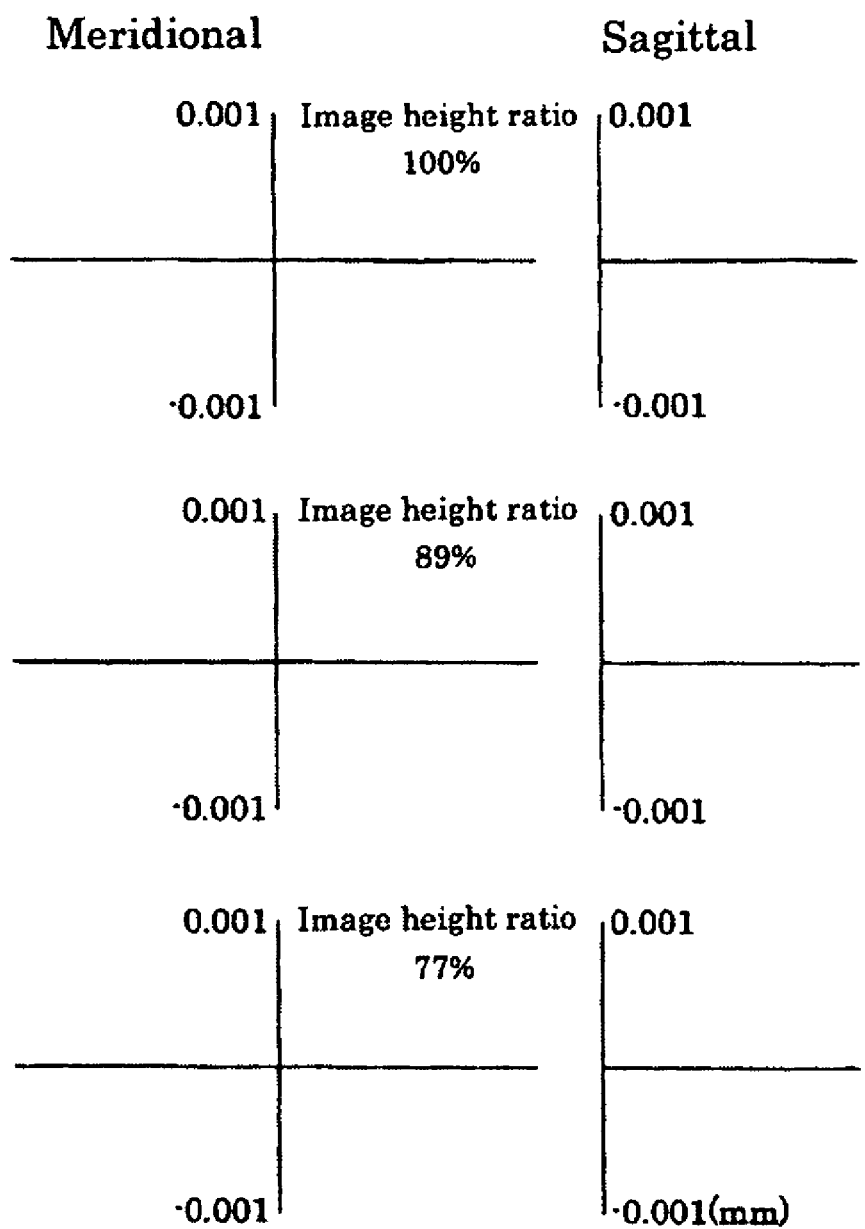
FIG. 12 shows coma aberration in the projection optical system of the fifth working example.

FIG. 12 is a drawing that shows coma aberration in the projection optical system of the fifth working example. FIG. 12 shows the meridional coma aberration and the sagittal coma aberration at image height ratio 100%, image height ratio 89% and image height ratio 77%. As is clear from the aberration diagram, it is understood that, in the fifth working example as well, coma aberration is corrected well in the region that corresponds to the effective image forming region ER in the same way as in the first working example~fourth working example. In addition, though a drawing has been omitted, it has been confirmed that various aberrations other than coma aberration, such as spherical aberration and distortion, are also corrected well in the region that corresponds to the effective image forming region ER.

SIXTH WORKING EXAMPLE

Figure 13:
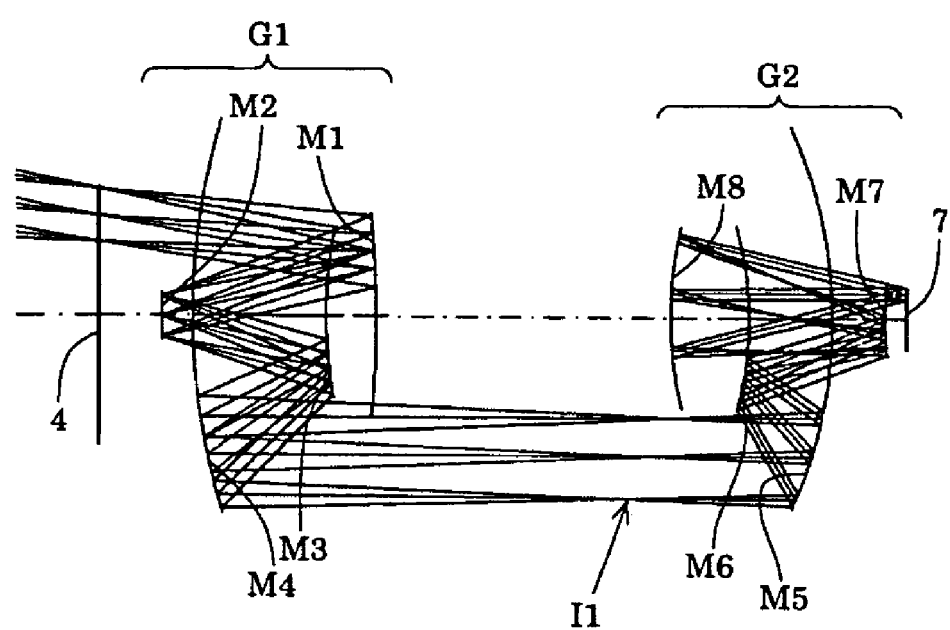
FIG. 13 is a drawing that shows the configuration of a projection optical system relating to the sixth working example of the present embodiment.

FIG. 13 is a drawing that shows the configuration of a projection optical system relating to the sixth working example of the present embodiment. Referring to FIG. 13, in the projection optical system of the sixth working example, the light from the mask 4 forms an intermediate image I1 of the mask pattern after being sequentially reflected by the concave reflecting surface of the first reflecting mirror M1, the concave reflecting surface of the second reflecting mirror M2, the convex reflecting surface of the third reflecting mirror M3, and the concave reflecting surface of the fourth reflecting mirror M4. Then, the light from the mask pattern intermediate image I1 formed via the first reflecting image forming optical system G1 forms a reduced image (secondary image) of the mask pattern on the wafer 7 after being sequentially reflected by the concave reflecting surface of the fifth reflecting mirror M5, the convex reflecting surface of the sixth reflecting mirror M6, the convex reflecting surface of the seventh reflecting mirror M7, and the concave reflecting surface of the eighth reflecting mirror M8. The values of the specifications of the projection optical system relating to the sixth working example are presented in Table (6) below.

TABLE (6)

(Main Specifications)

$\lambda = 13.5$ nm
$\beta = 1/4$
NA = 0.20
H0 = 196 mm
$\phi = 49.0$ mm
LX = 26 mm
LY = 20 mm (Optical Member Specifications)

| Surface Number | r | d | |
|---|---|---|---|
| | (Mask surface) | 538.59 | |
| 1 | −1614.79 | −418.59 | (First reflecting mirror M1) |
| | ∞ | 0.00 | (Aperture stop AS) |
| 2 | 1420.88 | 322.40 | (Second reflecting mirror M2) |
| 3 | 537.13 | −262.40 | (Third reflecting mirror M3) |
| 4 | 806.79 | 1236.65 | (Fourth reflecting mirror M4) |
| 5 | −584.42 | −156.20 | (Fifth reflecting mirror M5) |
| 6 | −431.38 | 256.20 | (Sixth reflecting mirror M6) |
| 7 | 474.30 | −407.60 | (Seventh reflecting mirror M7) |
| 8 | 498.30 | 447.60 | (Eighth reflecting mirror M8) |
| | (Wafer surface) | | |

(Aspheric Surface Data)

First surface $\kappa = 0.000000$
$C_4 = -0.936325 \times 10^{-9}$        $C_6 = -0.374535 \times 10^{-15}$
$C_8 = 0.120552 \times 10^{-18}$        $C_{10} = -0.603200 \times 10^{-23}$
$C_{12} = 0.226759 \times 10^{-27}$     $C_{14} = -0.433963 \times 10^{-32}$
$C_{16} = 0.300721 \times 10^{-37}$ Second surface $\kappa = 0.000000$
$C_4 = 0.145569 \times 10^{-8}$         $C_6 = 0.130305 \times 10^{-13}$
$C_8 = 0.288744 \times 10^{-16}$        $C_{10} = -0.494080 \times 10^{-19}$
$C_{12} = 0.527970 \times 10^{-22}$     $C_{14} = -0.304921 \times 10^{-25}$
$C_{16} = 0.721823 \times 10^{-29}$ Third surface $\kappa = 0.000000$
$C_4 = -0.360946 \times 10^{-8}$        $C_6 = 0.662389 \times 10^{-14}$
$C_8 = 0.610638 \times 10^{-18}$        $C_{10} = -0.101801 \times 10^{-21}$
$C_{12} = 0.753451 \times 10^{-26}$     $C_{14} = -0.284951 \times 10^{-30}$
$C_{16} = 0.432128 \times 10^{-35}$ Fourth surface $\kappa = 0.000000$
$C_4 = -0.242980 \times 10^{-9}$        $C_6 = -0.323320 \times 10^{-15}$
$C_8 = -0.389364 \times 10^{-20}$       $C_{10} = 0.527716 \times 10^{-25}$
$C_{12} = -0.603878 \times 10^{-30}$    $C_{14} = 0.365779 \times 10^{-35}$
$C_{16} = -0.973273 \times 10^{-41}$ TABLE (6)-continued Fifth surface $\kappa = 0.000000$
$C_4 = 0.204762 \times 10^{-9}$  $C_6 = 0.341285 \times 10^{-14}$
$C_8 = -0.950018 \times 10^{-19}$  $C_{10} = 0.175594 \times 10^{-23}$
$C_{12} = -0.191132 \times 10^{-28}$  $C_{14} = 0.115231 \times 10^{-33}$
$C_{16} = -0.293933 \times 10^{-39}$ Sixth surface $\kappa = 0.000000$
$C_4 = 0.365416 \times 10^{-10}$  $C_6 = 0.140726 \times 10^{-13}$
$C_8 = -0.685356 \times 10^{-17}$  $C_{10} = 0.626948 \times 10^{-21}$
$C_{12} = -0.323188 \times 10^{-25}$  $C_{14} = 0.908127 \times 10^{-30}$
$C_{16} = -0.107245 \times 10^{-34}$ Seventh surface $\kappa = 0.000000$
$C_4 = 0.173457 \times 10^{-7}$  $C_6 = 0.137342 \times 10^{-12}$
$C_8 = -0.525501 \times 10^{-17}$  $C_{10} = 0.569263 \times 10^{-20}$
$C_{12} = -0.237279 \times 10^{-23}$  $C_{14} = 0.539415 \times 10^{-27}$
$C_{16} = -0.477824 \times 10^{-31}$ Eighth surface $\kappa = 0.000000$
$C_4 = 0.666843 \times 10^{-10}$  $C_6 = 0.325887 \times 10^{-15}$
$C_8 = 0.197007 \times 10^{-20}$  $C_{10} = -0.101960 \times 10^{-25}$
$C_{12} = -0.163295 \times 10^{-29}$  $C_{14} = 0.121569 \times 10^{-33}$
$C_{16} = -0.230387 \times 10^{-38}$ (Conditional Expression Corresponding Values)

Dw = LY = 20 mm
Yc = φ-Dw/2 = 39 mm
|R6| = 431.38 mm
Mφ = 298.19 mm (Largest at the fourth reflecting mirror M4)
L12 = 570.46 mm
TL = 1556.65 mm
Mφ4 = 298.19 mm
Mφ5 = 290.37 mm
(1')Dw/Yc = 0.513
(2)|R6|/Yc = 11.06
(3)H0/Mφ = 0.657
(4)L12/TL = 0.366
(5)Mφ4/Mφ5 = 1.027

Figure 14:
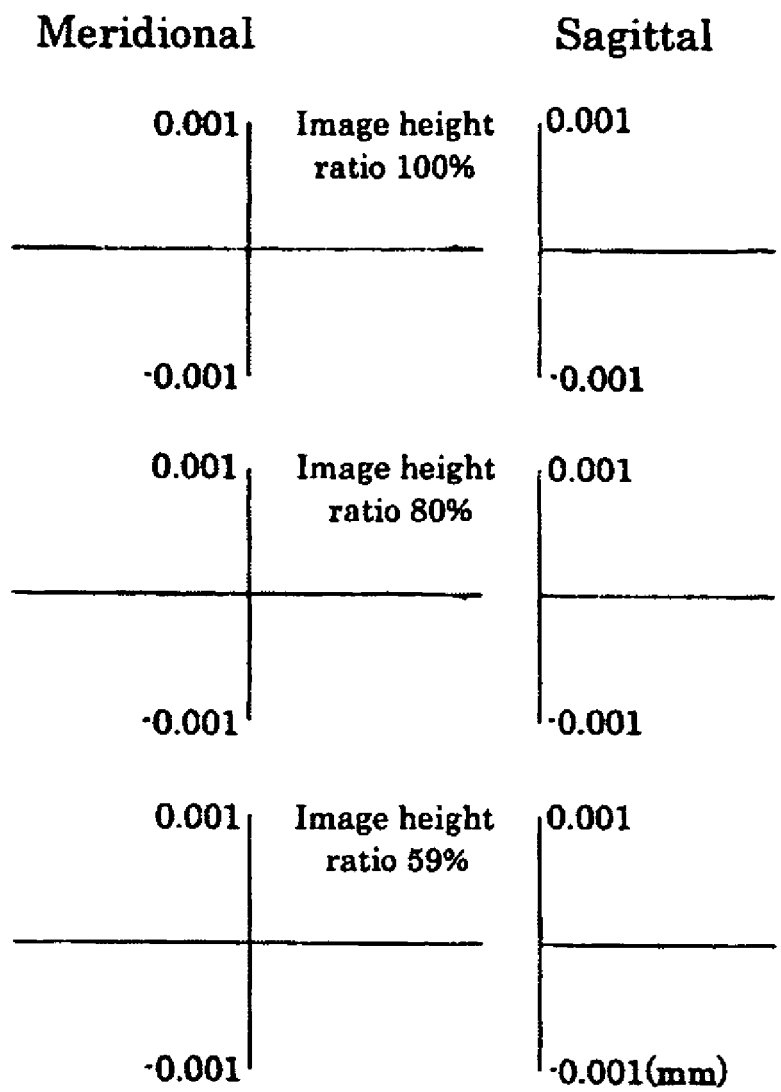
FIG. 14 is a drawing that shows coma aberration in the projection optical system of the sixth working example.

FIG. 14 is a drawing that shows coma aberration in the projection optical system of the sixth working example. FIG. 14 shows the meridional coma aberration and the sagittal coma aberration at image height ratio 100%, image height ratio 80% and image height ratio 59%. As is clear from the aberration diagram, it is understood that, in the sixth working example as well, coma aberration is corrected well in the region that corresponds to the effective image forming region ER in the same way as in the first working example–fifth working example. In addition, though a drawing has been omitted, it has been confirmed that various aberrations other than coma aberration, such as spherical aberration and distortion, are also corrected well in the region that corresponds to the effective image forming region ER.

In the first working example–third working example, Conditional Expressions (1) and (1A) are satisfied, but Conditional Expression (1') and Conditional Expression (2) are not satisfied. In addition, in the first working example and the second working example, the sixth reflecting mirror M6 has a convex reflecting surface, but, in the third working example, the sixth reflecting mirror M6 has a concave reflecting surface. Moreover, Conditional Expressions (1B) and (1C) are satisfied in the first working example, which ensures an image side numerical aperture of 0.4, Conditional Expression (1D) is satisfied in the second working example, which ensures an image side numerical aperture of 0.35, and Conditional Expression (1E) is satisfied in the third working example, which ensures an image side numerical aperture of 0.3.

In the fourth working example–sixth working example, not only Conditional Expressions (1) and (1A) are satisfied but the sixth reflecting mirror M6 has a convex reflecting surface, and Conditional Expression (1') and Conditional Expression (2) are satisfied. In addition, Conditional Expressions (1D) and (1'D) are satisfied in the fourth working example, which ensures an image side numerical aperture of 0.35, Conditional Expressions (1E) and (1'E) are satisfied in the fifth working example, which ensures an image side numerical aperture of 0.3, and Conditional Expressions (1F) and (1'F) are satisfied in the sixth working example, which ensures an image side numerical aperture of 0.2.

In the above way, it is possible to ensure a 26 mm×~5 mm arcuate effective image forming region in which the various aberrations have been corrected well on the wafer 7 while ensuring an image side numerical aperture of 0.4~0.3 with respect to a laser plasma x-ray with a wavelength of 13.5 nm. In the fourth working example–sixth working example, it is possible to ensure a 26 mm×~20 mm arcuate effective image forming region in which the various aberrations have been corrected well on the wafer 7 while ensuring an image side numerical aperture of 0.35~0.2 with respect to a laser plasma x-ray with a wavelength of 13.5 nm. Therefore, in the respective working examples, in the wafer 7, it is possible to transfer the pattern of the mask 4 to the respective exposure regions that have, for example, a size of 26 mm×66 mm at a high resolution of 0.1 μm or less through scanning exposure.

In addition, in the first working example–third working example, the effective radius of the fourth reflecting mirror M4, which is the largest, or the fifth reflecting mirror M5 is approximately 233~approximately 244 mm, and it is kept adequately small. In the fourth working example–sixth working example, the effective radius of the fourth reflecting mirror M4, which is the largest, is approximately 238~approximately 298 mm, and it is kept adequately small. In this way, in the respective working examples, increases in the size of the reflecting mirrors are restricted, and compactness of the optical system is pursued. Also, in the first working example–third working example, the distance (object-to-image distance) TL from the object (mask) to the image (wafer) is kept small to a range of approximately 1393 mm~approximately 1577 mm. In the fourth working example~sixth working example, the object-to-image distance TL is kept small to a range of approximately 1416 mm~approximately 1557 mm. In this way, in the respective working examples, optical performance is maintained well while restricting increases in size of the optical system in the optical axis direction.

Specifically, in the first working example, in an 8-mirror reflecting type optical system with an image formation magnification of ¼, in addition to an image side numerical aperture NA of 0.4 being ensured, an arcuate effective image forming region in which the width dimension Dw is 3 mm is realized. Specifically, in the first working example, an effective image forming region with a width dimension of 1.5 times that of a conventional 8-mirror reflecting type optical system that has an arcuate effective image forming region that is 2 mm in width described in the patent document discussed above is realized, so on the image plane or the object plane, it is possible to alleviate illumination in which the light beam is focused in a narrow region. As a result, it is possible to restrict temperature increases of structural bodies such as reticles arranged on the object plane and wafers arranged on the image plane as well as warping that is attributable to temperature increases. In the respective mirrors of the projection optical system, the region where the effective light beam that contributes to image formation is irradiated also becomes wider, so it is also possible to restrict temperature increases and warping of the respective mirrors. In particular, when anisotropic warping occurs in a member that has been illuminated by the light, it is difficult to correct it using other correcting members, so the effects of the projection optical system are particularly marked. In addition, if it is possible to make the Etendu of the light source sufficiently larger, then the exposure quantity of light will also become larger by the amount by which the width dimension Dw has been increased, so it is also possible to improve the throughput of the apparatus by shortening the exposure time compared to the conventional case.

Compared to the first working example, in the second working example, in the same 8-mirror reflecting type optical system with an image forming magnification ratio of ¼, the width dimension Dw of the arcuate effective image forming region is increased to 4 mm by reducing the image side numerical aperture NA to 0.35. In addition, in the third working example, in the same 8-mirror reflecting type optical system with an image forming magnification ratio of ¼, the width dimension Dw of the arcuate effective image forming region is increased to 5 mm by reducing the image side numerical aperture NA to 0.3. Therefore, in the second working example and the third working example, it is possible to further alleviate the focusing of the light beam on a narrow region compared to the first working example.

On the other hand, in the fourth working example, in an 8-mirror reflecting type optical system with an image forming magnification ratio of ¼, in addition to an image side numerical aperture NA of 0.35 being ensured, an arcuate effective image forming region in which the width dimension Dw is 6 mm is realized. Specifically, in the fourth working example, an effective image forming region with a width dimension three times that of the conventional 8-mirror reflecting type optical system with an arcuate effective image forming region with a 2 mm width described in the patent document discussed above is realized, so, on the image plane or the object plane, it is possible to alleviate illumination in which the light beam is focused on a narrow region. As a result, it is possible to restrict temperature increases of structural bodies such as reticles arranged on the object plane and wafers arranged on the image plane as well as warping that is attributable to temperature increases. Note that, in the respective mirrors of the projection optical system, the region where the effective light beam that contributes to image formation is irradiated also becomes wider, so it is also possible to restrict temperature increases and warping of the respective mirrors. In particular, when anisotropic warping occurs in a member that has been illuminated by the light, it is difficult to correct it using other correcting members, so the effects of the projection optical system are particularly marked. In addition, if it is possible to make the Etendu of the light source sufficiently larger, then the exposure quantity of light will also become larger by the amount by which the width dimension Dw has been increased, so it is also possible to improve the throughput of the apparatus by shortening the exposure time compared to the conventional case.

Compared to the fourth working example, in the fifth working example, in the same 8-mirror reflecting type optical system with an image forming magnification ratio of ¼, the width dimension Dw of the arcuate effective image forming region is increased to 10 mm by reducing the image side numerical aperture NA to 0.3. In addition, in the sixth working example, in the same 8-mirror reflecting type optical system with an image forming magnification ratio of ¼, the width dimension Dw of the arcuate effective image forming region is increased to 20 mm by reducing the image side numerical aperture NA to 0.2. Therefore, in the fifth working example and the sixth working example, it is possible to further alleviate the focusing of the light beam on a narrow region compared to the fourth working example. Also, compared to the first~third working examples, in the fourth working example~sixth working example, it becomes possible to make the width dimension of the arcuate effective image forming region relatively larger by making the radius of curvature of the reflecting mirror R6 of the sixth surface relatively smaller to form a convex shape.

In an exposure apparatus relating to the embodiment discussed above, by illuminating the mask by means of an illumination system (illumination process) and exposing the pattern for transfer formed on the mask onto a photosensitive substrate using a projection optical system (exposure process), it is possible to manufacture micro devices (semiconductor devices, image pickup elements, liquid crystal display elements, thin-film magnetic heads, etc.). An example of the technique when obtaining a semiconductor device as a micro device by forming a prescribed circuit pattern on a wafer, etc. as the photosensitive substrate using an exposure apparatus of the present embodiment will be explained below while referring to the flowchart in FIG. 15.

Figure 15:
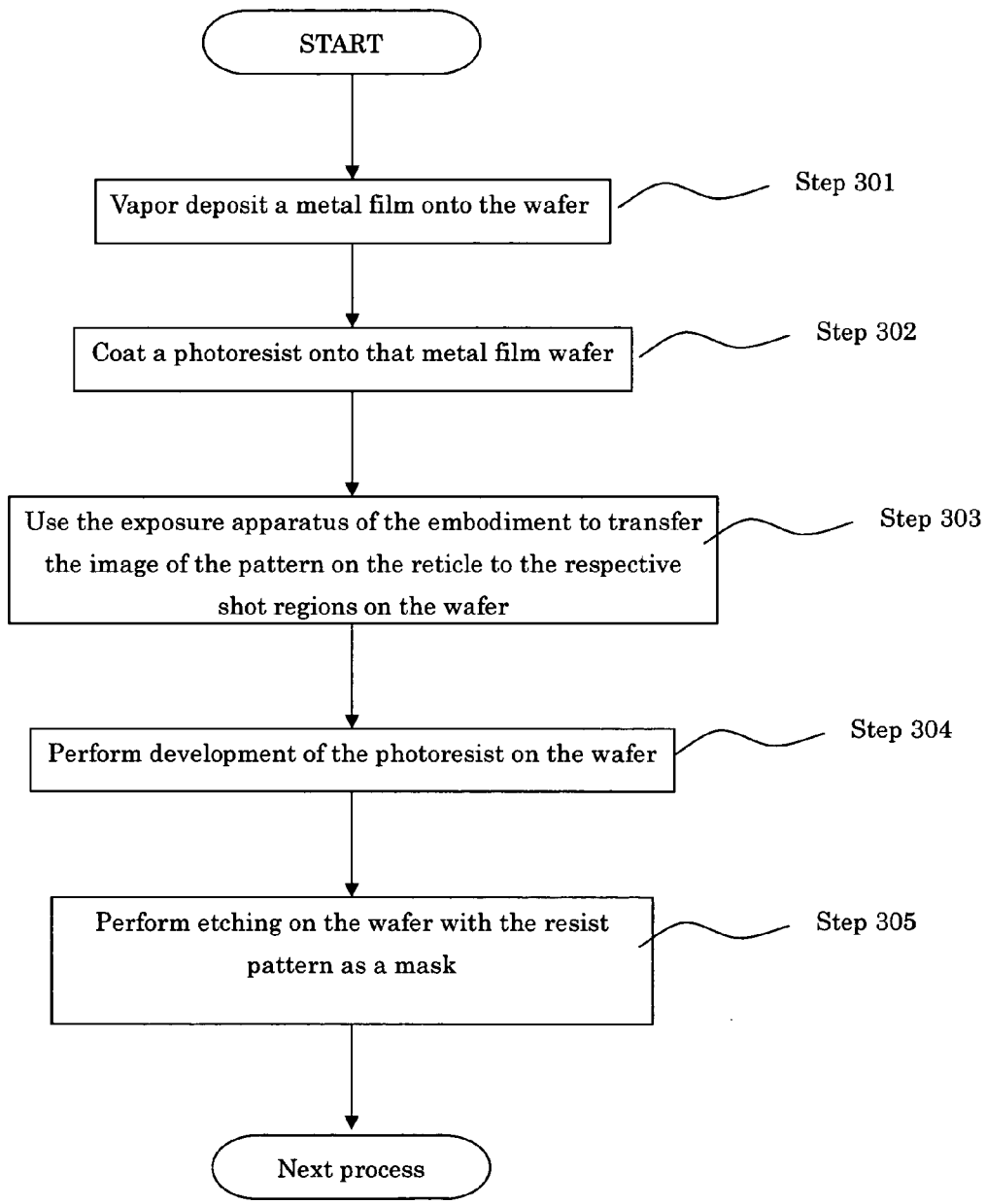
FIG. 15 shows an example of the technique when obtaining a semiconductor device as the micro device as well as a flowchart thereof.

First, in step 301 in FIG. 15, a metal film is vapor deposited onto a wafer of the first lot. Next, in step 302, a photoresist is coated onto the metal film on the wafer of that first lot. After that, in step 303, an exposure apparatus of the present embodiment is used to sequentially transfer expose the pattern image on the mask (reticle) to the respective shot regions on the wafer of that first lot via that projection optical system.

After that, in step 304, after development of the photoresist on the wafer of that first lot is performed, in step 305, a circuit pattern that corresponds to the pattern on the mask is formed on the respective shot regions on the respective wafers by performing etching with the resist pattern on the wafer of that first lot as a mask. After that, a device such as a semiconductor device is manufactured, for example, by performing formation of a circuit pattern of a layer that is further above. Through the aforementioned semiconductor device manufacturing method, it is possible to obtain semiconductor devices that have extremely fine circuit patterns at good throughput.

Note that, in the aforementioned present embodiment, a laser plasma x-ray source is used as the light source for supplying x-rays, but it is not limited to this, and it is also possible to use, for example, synchrotron radiation (SOR) light as the x-rays.

In addition, in the aforementioned present embodiment, the projection optical system is adapted to an exposure apparatus that has a light source for supplying x-rays, but it is not limited to this, and the projection optical system may also be adapted to exposure apparatuses that have light sources that supply light that has wavelengths other than that of x-rays.

Also, in the present embodiment discussed above, the present invention is adapted to a projection optical system of an exposure apparatus, but it is not limited to this, and it is also possible to adapt the present invention to other common projection optical systems.

In addition, the exposure apparatus EX of the present embodiment is manufactured by assembling subsystems, including the respective constituent elements discussed above, so that the prescribed mechanical precision, electrical precision and optical precision are maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems.

The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly of the various subsystems to the exposure apparatus has ended, overall adjustment is performed, and the various precisions are ensured for the exposure apparatus as a whole. Note that it is preferable that the manufacture of the exposure apparatus be performed in a clean room in which the temperature, the degree of cleanliness, etc. are controlled.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A projection optical system for forming a reduced image of a first surface on a second surface, comprising:
    a first reflecting image forming optical system for forming an intermediate image of the first surface, the first reflecting image forming optical system comprising a first reflecting mirror M1, a second reflecting mirror M2, a third reflecting mirror M3, and a fourth reflecting mirror M4 in order of incidence of light from the first surface side; and
    a second reflecting image forming optical system for forming an image of the intermediate image on the second surface, the second reflecting image forming optical system comprising a fifth reflecting mirror M5, a sixth reflecting mirror M6, a seventh reflecting mirror M7, and an eighth reflecting mirror M8 in order of incidence of light from the first surface side,
    the first reflecting mirror M1, the fourth reflecting mirror M4, the fifth reflecting mirror M5, and the eighth reflecting mirror M8 having concave reflecting surfaces,
    the seventh reflecting mirror M7 having a convex reflecting surface,
    one of the reflecting mirrors from among the second reflecting mirror M2 and the third reflecting mirror M3 having a concave reflecting surface, and the other reflecting mirror having a convex reflecting surface, and
    wherein when the distance between an optical axis and the center of an arcuate effective image forming region formed on the second surface is Yc, and the width dimension of the effective image forming region along a direction that connects the optical axis and the center of the effective image forming region is Dw, the condition 0.06<Dw/Yc is satisfied.

2. The projection optical system described in claim 1 wherein the image side numerical aperture NA is larger than 0.15, and the condition 0.064<Dw/Yc is satisfied.

3. The projection optical system described in claim 1 wherein the image side numerical aperture NA is larger than 0.35 and not larger than 0.55, and the condition 0.06<Dw/Yc<0.2 is satisfied.

4. The projection optical system described in claim 3 wherein the image side numerical aperture NA is larger than 0.35 and smaller than 0.45, and the condition 0.064<Dw/Yc<0.09 is satisfied.

5. The projection optical system described in claim 1 wherein the image side numerical aperture NA is larger than 0.3 and smaller than 0.4, and the condition 0.09<Dw/Yc<0.3 is satisfied.

6. The projection optical system described in claim 1 wherein the image side numerical aperture NA is larger than 0.25 and smaller than 0.35, and the condition 0.1<Dw/Yc<0.4 is satisfied.

7. The projection optical system described in claim 1 wherein the image side numerical aperture NA is larger than 0.15 and not larger than 0.25, and the condition 0.2<Dw/Yc<0.9 is satisfied.

8. The projection optical system described in claim 5 wherein the image side numerical aperture NA is larger than 0.3 and smaller than 0.4, and the condition 0.13<Dw/Yc<0.3 is satisfied.

9. The projection optical system described in claim 6 wherein the image side numerical aperture NA is larger than 0.25 and smaller than 0.35, and the condition 0.2<Dw/Yc<0.4 is satisfied.

10. The projection optical system described in claim 7 wherein the image side numerical aperture NA is larger than 0.15 and not larger than 0.25, and the condition 0.3<Dw/Yc<0.8 is satisfied.

11. The projection optical system described in claim 1 wherein the sixth reflecting mirror M6 has a convex reflecting surface.

12. The projection optical system described in claim 8 wherein, when the sixth reflecting mirror M6 has a convex reflecting surface, and the radius of curvature of the reflecting surface of the sixth reflecting mirror M6 is R6, the condition 5.0<|R6|/Yc<50.0 is satisfied.

13. The projection optical system described in claim 9 wherein, when the sixth reflecting mirror M6 has a convex reflecting surface, and the radius of curvature of the reflecting surface of the sixth reflecting mirror M6 is R6, the condition 5.0<|R6|/Yc<50.0 is satisfied.

14. The projection optical system described in claim 10 wherein, when the sixth reflecting mirror M6 has a convex reflecting surface, and the radius of curvature of the reflecting surface of the sixth reflecting mirror M6 is R6, the condition 5.0<|R6|/Yc<50.0 is satisfied.

15. A projection optical system described in claim 1 wherein, when the sixth reflecting mirror M6 has a convex reflecting surface, and the radius of curvature of the reflecting surface of the sixth reflecting mirror M6 is R6, the conditions 0.13<Dw/Yc<0.8 and 5.0<|R6|/Yc<50.0 are satisfied.

16. The projection optical system described in claim 15 wherein the condition 8.0<|R6|/Yc<15.0 is satisfied.

17. The projection optical system described in claim 1 wherein the width dimension Dw of the effective image forming region is 2.5 mm or more.

18. The projection optical system described in claim 1 wherein, when the maximum object height at the first surface is H0, and the maximum value of the effective radii of the eight reflecting mirrors M1~M8 is Mφ, the condition 0.5<H0/Mφ is satisfied 19. The projection optical system described in claim 1 wherein, when the axial interval between the reflecting surface nearest the second surface in the first reflecting image forming optical system and the reflecting surface nearest the first surface in the second reflecting image forming optical system is L12, and the axial interval between the first surface and the second surface is TL, the condition 0.1<L12/TL<0.7 is satisfied.

20. The projection optical system described in claim 1 wherein the reflecting mirrors M1~M8 each have a reflecting surface formed in an aspheric shape.

21. The projection optical system described in claim 1 further comprising an aperture stop provided on the reflecting surface of the second reflecting mirror M2.

22. The projection optical system described in claim 1 wherein, when the effective radius of the fourth reflecting mirror M4, which is arranged first in sequence from the intermediate image to the first surface side is $M\phi 4$, and the effective radius of the fifth reflecting mirror M5, which is arranged first in sequence from the intermediate image to the second surface side is $M\phi 5$, the condition $0.85<M\phi 4/M\phi 5<1.2$ is satisfied.

23. An exposure apparatus, comprising:
   an illumination system for illuminating a mask that has been set up on a first surface, and
   the projection optical system described in claim 1 for projecting the pattern of the mask onto a photosensitive substrate that has been set up on the second surface.

24. A method for manufacturing an exposure apparatus having a projection optical system that forms a reduced image of a first surface on a second surface, the method comprising the steps of:
   providing a first reflecting image forming optical system for forming an intermediate image of the first surface, the first reflecting image forming optical system comprising a first reflecting mirror M1, a second reflecting mirror M2, a third reflecting mirror M3, and a fourth reflecting mirror M4 arranged in order of incidence of light from the first surface side; and
   providing a second reflecting image forming optical system for forming an image of the intermediate image on the second surface, the second reflecting image forming optical system comprising a fifth reflecting mirror M5, a sixth reflecting mirror M6, a seventh reflecting mirror M7, and an eighth reflecting mirror M8 arranged in order of incidence of light from the first surface side,
   the first reflecting mirror M1, the fourth reflecting mirror M4, the fifth reflecting mirror M5, and the eighth reflecting mirror M8 each having a concave reflecting surface,
   the seventh reflecting mirror M7 having a convex reflecting surface,
   one of the second reflecting mirror M2 and the third reflecting mirror M3 having a concave reflecting surface, and the other reflecting mirror having a convex reflecting surface, and
   wherein, when the distance between optical axis and the center of an arcuate effective image forming region formed on the second surface is Yc, and the width dimension of the effective image forming region along a direction that connects the optical axis and the center of the effective image forming region is Dw, the condition $0.06<Dw/Yc$ is satisfied.

25. A device manufacturing method comprising the steps of: exposing a pattern of a mask on a photosensitive substrate with an exposure apparatus manufactured by the exposure apparatus manufacturing method described in claim 24, and developing the exposed photosensitive substrate.

* * * * *

UNITED STATES PATENT AND TRADEMARK OFFICE
CERTIFICATE OF CORRECTION

PATENT NO. : 7,630,057 B2  Page 1 of 1
APPLICATION NO. : 11/508290
DATED : December 8, 2009
INVENTOR(S) : Tomowaki Takahashi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 633 days.

Signed and Sealed this

Second Day of November, 2010

David J. Kappos
*Director of the United States Patent and Trademark Office*